United States Patent
Ahn et al.

(10) Patent No.: US 7,915,174 B2
(45) Date of Patent: Mar. 29, 2011

(54) DIELECTRIC STACK CONTAINING LANTHANUM AND HAFNIUM

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/177,668

(22) Filed: Jul. 22, 2008

(65) Prior Publication Data

US 2009/0032910 A1 Feb. 5, 2009

Related U.S. Application Data

(60) Continuation of application No. 11/584,229, filed on Oct. 20, 2006, now Pat. No. 7,411,237, which is a division of application No. 11/010,529, filed on Dec. 13, 2004, now Pat. No. 7,235,501.

(51) Int. Cl.
*H01L 21/461* (2006.01)

(52) U.S. Cl. ........ 438/722; 438/720; 438/721; 257/296; 257/E21.646; 257/E21.247

(58) Field of Classification Search .................. 257/344, 257/403, 411, 701, 632, 724
See application file for complete search history.

(56) References Cited

U.S. PATENT DOCUMENTS

| | | |
|---|---|---|
| 3,357,961 A | 12/1967 | Makowski et al. |
| 3,488,633 A | 1/1970 | King et al. |
| 4,058,430 A | 11/1977 | Suntola et al. |
| 4,413,022 A | 11/1983 | Suntola et al. |
| 4,542,870 A | 9/1985 | Howell |
| 4,972,516 A | 11/1990 | Bryan et al. |
| 5,049,516 A | 9/1991 | Arima |
| 5,055,319 A | 10/1991 | Bunshah et al. |
| 5,057,447 A | 10/1991 | Paterson |
| 5,100,825 A | 3/1992 | Fazan et al. |
| 5,252,370 A | 10/1993 | Tominaga et al. |
| 5,334,433 A | 8/1994 | Tominaga |
| 5,364,708 A | 11/1994 | Tominaga |
| 5,401,609 A | 3/1995 | Haratani et al. |
| 5,406,546 A | 4/1995 | Uchiyama et al. |
| 5,418,030 A | 5/1995 | Tominaga et al. |
| 5,426,603 A | 6/1995 | Nakamura et al. |
| 5,430,706 A | 7/1995 | Utsunomiya et al. |
| 5,445,699 A | 8/1995 | Kamikawa et al. |
| 5,470,628 A | 11/1995 | Tominaga et al. |
| 5,496,597 A | 3/1996 | Soininen et al. |
| 5,498,507 A | 3/1996 | Handa et al. |

(Continued)

FOREIGN PATENT DOCUMENTS

WO WO-01/97257 12/2001

(Continued)

OTHER PUBLICATIONS

Somorjai, "Introduction to surface chemistry and catalysis", (1994), 336-337.

(Continued)

*Primary Examiner* — Dung A. Le

(74) *Attorney, Agent, or Firm* — Schwegman, Lundberg & Woessner, P.A.

(57) ABSTRACT

Dielectric layers containing a dielectric layer including lanthanum and hafnium and methods of fabricating such dielectric layers provide an insulating layer in a variety of structures for use in a wide range of electronic devices.

25 Claims, 5 Drawing Sheets

U.S. PATENT DOCUMENTS

| | | | |
|---|---|---|---|
| 5,523,140 A | 6/1996 | Tominaga et al. |
| 5,552,237 A | 9/1996 | Utsunomiya et al. |
| 5,562,952 A | 10/1996 | Nakahigashi et al. |
| 5,569,517 A | 10/1996 | Tominaga et al. |
| 5,572,052 A | 11/1996 | Kashihara et al. |
| 5,577,020 A | 11/1996 | Utsunomiya et al. |
| 5,593,789 A | 1/1997 | Utsunomiya et al. |
| 5,620,766 A | 4/1997 | Uchiyama et al. |
| 5,627,012 A | 5/1997 | Tominaga et al. |
| 5,637,371 A | 6/1997 | Tominaga et al. |
| 5,637,372 A | 6/1997 | Tominaga et al. |
| 5,646,583 A | 7/1997 | Seabury et al. |
| 5,674,563 A | 10/1997 | Tarui et al. |
| 5,698,022 A | 12/1997 | Glassman et al. |
| 5,700,567 A | 12/1997 | Utsunomiya |
| 5,751,021 A | 5/1998 | Teraguchi |
| 5,792,269 A | 8/1998 | Deacon et al. |
| 5,801,105 A | 9/1998 | Yano et al. |
| 5,810,923 A | 9/1998 | Yano et al. |
| 5,825,046 A | 10/1998 | Czubatyj et al. |
| 5,827,571 A | 10/1998 | Lee et al. |
| 5,828,080 A | 10/1998 | Yano et al. |
| 5,840,897 A | 11/1998 | Kirlin et al. |
| 5,891,542 A | 4/1999 | Tominaga et al. |
| 5,906,874 A | 5/1999 | Takahashi et al. |
| 5,916,365 A | 6/1999 | Sherman |
| 5,965,323 A | 10/1999 | Takahashi et al. |
| 5,981,014 A | 11/1999 | Tsukagoshi et al. |
| 6,002,418 A | 12/1999 | Yoneda et al. |
| 6,010,969 A | 1/2000 | Vaartstra |
| 6,019,848 A | 2/2000 | Frankel et al. |
| 6,020,024 A | 2/2000 | Maiti et al. |
| 6,020,243 A | 2/2000 | Wallace et al. |
| 6,025,627 A | 2/2000 | Forbes et al. |
| 6,027,961 A | 2/2000 | Maiti et al. |
| 6,030,679 A | 2/2000 | Saito et al. |
| 6,040,030 A | 3/2000 | Utsunomiya et al. |
| 6,051,363 A | 4/2000 | Utsunomiya et al. |
| 6,059,885 A | 5/2000 | Ohashi et al. |
| 6,061,077 A | 5/2000 | Kashiwaya et al. |
| 6,081,287 A | 6/2000 | Noshita et al. |
| 6,087,067 A | 7/2000 | Kato et al. |
| 6,087,674 A | 7/2000 | Ovshinsky et al. |
| 6,103,330 A | 8/2000 | Kosuda et al. |
| 6,110,529 A | 8/2000 | Gardiner et al. |
| 6,115,401 A | 9/2000 | Scobey et al. |
| 6,136,168 A | 10/2000 | Masujima et al. |
| 6,137,520 A | 10/2000 | Kashiwaya et al. |
| 6,153,355 A | 11/2000 | Takahashi et al. |
| 6,175,377 B1 | 1/2001 | Noshita et al. |
| 6,200,893 B1 | 3/2001 | Sneh |
| 6,203,613 B1 | 3/2001 | Gates et al. |
| 6,207,589 B1 | 3/2001 | Ma et al. |
| 6,211,035 B1 | 4/2001 | Moise et al. |
| 6,217,645 B1 | 4/2001 | Vaartstra |
| 6,225,163 B1 | 5/2001 | Bergemont |
| 6,225,237 B1 | 5/2001 | Vaartstra |
| 6,230,651 B1 | 5/2001 | Ni et al. |
| 6,242,157 B1 | 6/2001 | Tominaga et al. |
| 6,243,941 B1 | 6/2001 | Kashiwaya et al. |
| 6,256,052 B1 | 7/2001 | Yoneda |
| 6,256,053 B1 | 7/2001 | Noshita et al. |
| 6,273,951 B1 | 8/2001 | Vaartstra |
| 6,274,937 B1 | 8/2001 | Ahn et al. |
| 6,281,042 B1 | 8/2001 | Ahn et al. |
| 6,294,420 B1 | 9/2001 | Tsu et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,310,376 B1 | 10/2001 | Ueda et al. |
| 6,313,035 B1 | 11/2001 | Sandhu et al. |
| 6,316,054 B1 | 11/2001 | Kashiwaya et al. |
| 6,323,081 B1 | 11/2001 | Marsh |
| 6,323,511 B1 | 11/2001 | Marsh |
| 6,329,036 B1 | 12/2001 | Kikukawa et al. |
| 6,329,286 B1 | 12/2001 | Vaartstra |
| 6,331,465 B1 | 12/2001 | Forbes et al. |
| 6,337,704 B1 | 1/2002 | Yamaguchi |
| 6,342,445 B1 | 1/2002 | Marsh |
| 6,347,749 B1 | 2/2002 | Moore et al. |
| 6,350,704 B1 | 2/2002 | Ahn et al. |
| 6,351,276 B1 | 2/2002 | Yamaguchi |
| 6,358,766 B1 | 3/2002 | Kasahara |
| 6,365,470 B1 | 4/2002 | Maeda |
| 6,368,398 B2 | 4/2002 | Vaartstra |
| 6,380,579 B1 | 4/2002 | Nam et al. |
| 6,387,712 B1 | 5/2002 | Yano et al. |
| 6,395,650 B1 | 5/2002 | Callegari et al. |
| 6,403,414 B2 | 6/2002 | Marsh |
| 6,404,027 B1 | 6/2002 | Hong et al. |
| 6,406,772 B2 | 6/2002 | Tominaga et al. |
| 6,407,435 B1 | 6/2002 | Ma et al. |
| 6,410,368 B1 | 6/2002 | Kawasaki et al. |
| 6,420,279 B1 | 7/2002 | Ono et al. |
| 6,426,245 B1 | 7/2002 | Kawasaki et al. |
| 6,426,292 B2 | 7/2002 | Vaartstra |
| 6,441,417 B1 | 8/2002 | Zhang et al. |
| 6,444,592 B1 | 9/2002 | Ballantine et al. |
| 6,451,641 B1 | 9/2002 | Halliyal et al. |
| 6,451,695 B2 | 9/2002 | Sneh |
| 6,452,229 B1 | 9/2002 | Krivokapic |
| 6,455,330 B1 | 9/2002 | Yao et al. |
| 6,455,717 B1 | 9/2002 | Vaartstra |
| 6,458,701 B1 | 10/2002 | Chae et al. |
| 6,461,710 B1 | 10/2002 | Kikukawa et al. |
| 6,465,334 B1 | 10/2002 | Buynoski et al. |
| 6,482,740 B2 | 11/2002 | Soininen et al. |
| 6,492,659 B1 | 12/2002 | Yamazaki et al. |
| 6,495,436 B2 | 12/2002 | Ahn et al. |
| 6,495,437 B1 | 12/2002 | Yu |
| 6,495,449 B1 | 12/2002 | Nguyen |
| 6,495,458 B2 | 12/2002 | Marsh |
| 6,509,280 B2 | 1/2003 | Choi |
| 6,514,820 B2 | 2/2003 | Ahn et al. |
| 6,514,828 B2 | 2/2003 | Ahn et al. |
| 6,528,858 B1 | 3/2003 | Yu et al. |
| 6,531,354 B2 | 3/2003 | Maria et al. |
| 6,534,357 B1 | 3/2003 | Basceri |
| 6,534,420 B2 | 3/2003 | Ahn et al. |
| 6,537,613 B1 | 3/2003 | Senzaki et al. |
| 6,537,721 B2 | 3/2003 | Inoue et al. |
| 6,541,079 B1 | 4/2003 | Bojarczuk, Jr. et al. |
| 6,542,229 B1 | 4/2003 | Kalal et al. |
| 6,544,846 B2 | 4/2003 | Ahn et al. |
| 6,551,929 B1 | 4/2003 | Kori et al. |
| 6,552,383 B2 | 4/2003 | Ahn et al. |
| 6,552,388 B2 | 4/2003 | Wilk et al. |
| 6,555,875 B2 | 4/2003 | Kawasaki et al. |
| 6,555,879 B1 | 4/2003 | Krivokapic et al. |
| 6,558,563 B2 | 5/2003 | Kashiwaya et al. |
| 6,562,491 B1 | 5/2003 | Jeon |
| 6,570,248 B1 | 5/2003 | Ahn et al. |
| 6,586,792 B2 | 7/2003 | Ahn et al. |
| 6,592,942 B1 | 7/2003 | Van Wijck |
| 6,596,583 B2 | 7/2003 | Agarwal et al. |
| 6,599,788 B1 | 7/2003 | Kawasaki et al. |
| 6,602,720 B2 | 8/2003 | Hsu et al. |
| 6,608,378 B2 | 8/2003 | Ahn et al. |
| 6,613,656 B2 | 9/2003 | Li |
| 6,617,634 B2 | 9/2003 | Marsh et al. |
| 6,617,639 B1 | 9/2003 | Wang et al. |
| 6,624,013 B2 | 9/2003 | Kawasaki et al. |
| 6,632,279 B1 | 10/2003 | Ritala et al. |
| 6,638,810 B2 | 10/2003 | Bakli et al. |
| 6,638,859 B2 | 10/2003 | Sneh et al. |
| 6,642,567 B1 | 11/2003 | Marsh |
| 6,642,573 B1 | 11/2003 | Halliyal et al. |
| 6,645,882 B1 | 11/2003 | Halliyal et al. |
| 6,646,307 B1 | 11/2003 | Yu et al. |
| 6,652,924 B2 | 11/2003 | Sherman |
| 6,653,657 B2 | 11/2003 | Kawasaki et al. |
| 6,656,764 B1 | 12/2003 | Wang et al. |
| 6,660,578 B1 | 12/2003 | Karlsson et al. |
| 6,660,631 B1 | 12/2003 | Marsh |
| 6,660,660 B2 | 12/2003 | Haukka et al. |
| 6,661,058 B2 | 12/2003 | Ahn et al. |
| 6,664,154 B1 | 12/2003 | Bell et al. |

| | | |
|---|---|---|
| 6,673,701 B1 | 1/2004 | Marsh et al. |
| 6,682,602 B2 | 1/2004 | Vaartstra |
| 6,686,212 B1 | 2/2004 | Conley, Jr. et al. |
| 6,688,951 B2 | 2/2004 | Kashiwaya et al. |
| 6,690,055 B1 | 2/2004 | Uhlenbrock et al. |
| 6,699,747 B2 | 3/2004 | Ruff et al. |
| 6,706,115 B2 | 3/2004 | Leskela et al. |
| 6,709,989 B2 | 3/2004 | Ramdani et al. |
| 6,710,538 B1 | 3/2004 | Ahn et al. |
| 6,713,846 B1 | 3/2004 | Senzaki |
| 6,720,221 B1 | 4/2004 | Ahn et al. |
| 6,727,169 B1 | 4/2004 | Raaijmakers et al. |
| 6,730,163 B2 | 5/2004 | Vaartstra |
| 6,730,164 B2 | 5/2004 | Vaartstra et al. |
| 6,730,575 B2 | 5/2004 | Eldridge |
| 6,731,590 B1 | 5/2004 | Shingai et al. |
| 6,746,930 B2 | 6/2004 | Yang et al. |
| 6,748,959 B1 | 6/2004 | Kashiwaya et al. |
| 6,753,567 B2 | 6/2004 | Maria et al. |
| 6,762,081 B2 | 7/2004 | Yamazaki et al. |
| 6,762,114 B1 | 7/2004 | Chambers |
| 6,767,582 B1 | 7/2004 | Elers |
| 6,767,795 B2 | 7/2004 | Ahn et al. |
| 6,770,536 B2 | 8/2004 | Wilk et al. |
| 6,774,050 B2 | 8/2004 | Ahn et al. |
| 6,777,353 B2 | 8/2004 | Putkonen |
| 6,780,704 B1 | 8/2004 | Raaijmakers et al. |
| 6,784,049 B2 | 8/2004 | Vaartstra |
| 6,787,413 B2 | 9/2004 | Ahn |
| 6,787,421 B2 | 9/2004 | Gilmer et al. |
| 6,790,791 B2 | 9/2004 | Ahn et al. |
| 6,794,284 B2 | 9/2004 | Vaartstra |
| 6,794,315 B1 | 9/2004 | Klemperer et al. |
| 6,794,709 B2 | 9/2004 | Ahn et al. |
| 6,797,561 B2 | 9/2004 | Ko et al. |
| 6,800,567 B2 | 10/2004 | Cho |
| 6,803,311 B2 | 10/2004 | Choi |
| 6,803,326 B2 | 10/2004 | Ahn et al. |
| 6,804,136 B2 | 10/2004 | Forbes |
| 6,806,211 B2 | 10/2004 | Shinriki et al. |
| 6,808,978 B2 | 10/2004 | Kim |
| 6,809,370 B1 | 10/2004 | Colombo et al. |
| 6,812,100 B2 | 11/2004 | Ahn et al. |
| 6,812,517 B2 | 11/2004 | Baker |
| 6,828,632 B2 | 12/2004 | Bhattacharyya |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,844,249 B2 | 1/2005 | Kawasaki et al. |
| 6,844,260 B2 | 1/2005 | Sarigiannis et al. |
| 6,844,604 B2 | 1/2005 | Lee et al. |
| 6,852,167 B2 | 2/2005 | Ahn |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,863,727 B1 | 3/2005 | Elers et al. |
| 6,864,191 B2 | 3/2005 | Yoon |
| 6,878,624 B1 | 4/2005 | Bruley et al. |
| 6,884,719 B2 | 4/2005 | Chang et al. |
| 6,884,739 B2 | 4/2005 | Ahn et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,909,156 B2 | 6/2005 | Aoyama |
| 6,914,800 B2 | 7/2005 | Ahn et al. |
| 6,921,702 B2 | 7/2005 | Ahn et al. |
| 6,929,840 B2 | 8/2005 | Hosoda et al. |
| 6,930,059 B2 | 8/2005 | Conley, Jr. et al. |
| 6,936,508 B2 | 8/2005 | Visokay et al. |
| 6,949,433 B1 | 9/2005 | Hidehiko et al. |
| 6,950,340 B2 | 9/2005 | Bhattacharyya |
| 6,952,032 B2 | 10/2005 | Forbes et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,967,159 B2 | 11/2005 | Vaartstra |
| 6,979,623 B2 | 12/2005 | Rotondaro et al. |
| 6,979,855 B2 | 12/2005 | Ahn et al. |
| 6,984,591 B1 | 1/2006 | Buchanan et al. |
| 6,984,592 B2 | 1/2006 | Vaartstra |
| 6,989,565 B1 | 1/2006 | Aronowitz et al. |
| 6,989,573 B2 | 1/2006 | Ahn et al. |
| 6,995,081 B2 | 2/2006 | Vaartstra |
| 7,005,697 B2 | 2/2006 | Batra et al. |
| 7,014,903 B2 | 3/2006 | Takasaki et al. |
| 7,015,534 B2 | 3/2006 | Colombo |
| 7,018,694 B2 | 3/2006 | Hosoda et al. |
| 7,018,695 B2 | 3/2006 | Kakiuchi et al. |
| 7,026,694 B2 | 4/2006 | Ahn et al. |
| 7,030,042 B2 | 4/2006 | Vaartstra et al. |
| 7,041,609 B2 | 5/2006 | Vaartstra |
| 7,045,406 B2 | 5/2006 | Huotari et al. |
| 7,045,430 B2 | 5/2006 | Ahn et al. |
| 7,045,431 B2 | 5/2006 | Rotondaro et al. |
| 7,049,192 B2 | 5/2006 | Ahn et al. |
| 7,057,244 B2 | 6/2006 | Andreoni et al. |
| 7,064,058 B2 | 6/2006 | Ahn et al. |
| 7,068,544 B2 | 6/2006 | Forbes et al. |
| 7,071,066 B2 | 7/2006 | Wang et al. |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,091,119 B2 | 8/2006 | Colombo |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,530 B2 | 10/2006 | Quevedo-Lopez et al. |
| 7,122,409 B2 | 10/2006 | Kawasaki et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,361 B2 | 11/2006 | Visokay et al. |
| 7,135,369 B2 | 11/2006 | Ahn et al. |
| 7,135,370 B2 | 11/2006 | Baker |
| 7,135,421 B2 | 11/2006 | Ahn et al. |
| 7,136,343 B2 | 11/2006 | Inoue et al. |
| 7,141,278 B2 | 11/2006 | Koh et al. |
| 7,141,288 B2 | 11/2006 | Inoue et al. |
| 7,141,289 B2 | 11/2006 | Inoue et al. |
| 7,144,825 B2 | 12/2006 | Adetutu et al. |
| 7,148,546 B2 | 12/2006 | Visokay et al. |
| 7,154,118 B2 | 12/2006 | Lindert et al. |
| 7,154,836 B2 | 12/2006 | Inoue et al. |
| 7,157,128 B2 | 1/2007 | Inoue et al. |
| 7,160,577 B2 | 1/2007 | Ahn et al. |
| 7,160,597 B2 | 1/2007 | Inoue et al. |
| 7,161,894 B2 | 1/2007 | Judge et al. |
| 7,166,347 B2 | 1/2007 | Inoue et al. |
| 7,167,440 B2 | 1/2007 | Inoue et al. |
| 7,176,076 B2 | 2/2007 | Chambers et al. |
| 7,182,990 B2 | 2/2007 | Inoue et al. |
| 7,183,186 B2 | 2/2007 | Ahn et al. |
| 7,196,007 B2 | 3/2007 | Vaartstra |
| 7,208,793 B2 | 4/2007 | Bhattacharyya |
| 7,211,492 B2 | 5/2007 | Forbes et al. |
| 7,214,416 B2 | 5/2007 | Nakai et al. |
| 7,214,994 B2 | 5/2007 | Forbes et al. |
| 7,226,830 B2 | 6/2007 | Colombo et al. |
| 7,235,854 B2 | 6/2007 | Ahn et al. |
| 7,241,686 B2 | 7/2007 | Marcadal et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,279,732 B2 | 10/2007 | Meng et al. |
| 7,291,526 B2 | 11/2007 | Li |
| 7,294,556 B2 | 11/2007 | Vaartstra |
| 7,300,870 B2 | 11/2007 | Vaartstra |
| 7,323,423 B2 | 1/2008 | Brask et al. |
| 7,323,424 B2 | 1/2008 | Ahn et al. |
| 7,332,442 B2 | 2/2008 | Vaartstra et al. |
| 7,374,617 B2 | 3/2008 | Vaartstra |
| 7,365,027 B2 | 4/2008 | Ahn et al. |

| | | |
|---|---|---|
| 7,368,402 B2 | 5/2008 | Vaartstra |
| 7,388,246 B2 | 6/2008 | Ahn et al. |
| 7,396,719 B2 | 7/2008 | Kim et al. |
| 7,410,668 B2 | 8/2008 | Ahn |
| 7,410,910 B2 | 8/2008 | Ahn et al. |
| 7,410,917 B2 | 8/2008 | Ahn et al. |
| 7,410,918 B2 | 8/2008 | Vaartstra |
| 7,411,237 B2 | 8/2008 | Ahn et al. |
| 7,432,548 B2 | 10/2008 | Forbes et al. |
| 7,439,194 B2 | 10/2008 | Ahn et al. |
| 7,473,956 B2 | 1/2009 | Eldridge et al. |
| 7,494,939 B2 | 2/2009 | Ahn et al. |
| 7,498,230 B2 | 3/2009 | Ahn et al. |
| 7,508,025 B2 | 3/2009 | Eldridge et al. |
| 7,508,648 B2 | 3/2009 | Ahn et al. |
| 7,510,983 B2 | 3/2009 | Ahn et al. |
| 7,511,326 B2 | 3/2009 | Ahn et al. |
| 7,517,783 B2 | 4/2009 | Ahn et al. |
| 7,518,246 B2 | 4/2009 | Ahn et al. |
| 7,531,869 B2 | 5/2009 | Ahn et al. |
| 7,544,604 B2 | 6/2009 | Forbes et al. |
| 7,554,161 B2 | 6/2009 | Ahn et al. |
| 7,560,395 B2 | 7/2009 | Ahn |
| 7,560,793 B2 | 7/2009 | Derderian et al. |
| 7,563,730 B2 | 7/2009 | Forbes et al. |
| 7,572,695 B2 | 8/2009 | Ahn et al. |
| 7,588,988 B2 | 9/2009 | Ahn et al. |
| 7,592,251 B2 | 9/2009 | Ahn et al. |
| 7,601,649 B2 | 10/2009 | Ahn et al. |
| 7,602,030 B2 | 10/2009 | Ahn et al. |
| 7,605,030 B2 | 10/2009 | Forbes et al. |
| 7,611,959 B2 | 11/2009 | Ahn et al. |
| 7,615,438 B2 | 11/2009 | Ahn et al. |
| 7,625,794 B2 | 12/2009 | Ahn et al. |
| 7,662,729 B2 | 2/2010 | Ahn et al. |
| 7,687,409 B2 | 3/2010 | Ahn et al. |
| 7,700,989 B2 | 4/2010 | Ahn et al. |
| 7,719,065 B2 | 5/2010 | Ahn et al. |
| 7,727,905 B2 | 6/2010 | Ahn et al. |
| 7,759,747 B2 | 7/2010 | Forbes et al. |
| 7,776,762 B2 | 8/2010 | Ahn et al. |
| 7,776,765 B2 | 8/2010 | Forbes et al. |
| 2001/0002280 A1 | 5/2001 | Sneh |
| 2001/0009695 A1 | 7/2001 | Saanila et al. |
| 2001/0015441 A1 | 8/2001 | Kawasaki et al. |
| 2001/0030352 A1 | 10/2001 | Ruf et al. |
| 2001/0031332 A1 | 10/2001 | Tominaga et al. |
| 2001/0032995 A1 | 10/2001 | Maria et al. |
| 2001/0042505 A1 | 11/2001 | Vaartstra |
| 2001/0052752 A1 | 12/2001 | Ghosh et al. |
| 2001/0054598 A1 | 12/2001 | Kashiwaya et al. |
| 2002/0001971 A1 | 1/2002 | Cho |
| 2002/0003403 A1 | 1/2002 | Ghosh et al. |
| 2002/0004276 A1 | 1/2002 | Ahn et al. |
| 2002/0004277 A1 | 1/2002 | Ahn et al. |
| 2002/0020429 A1 | 2/2002 | Selbrede |
| 2002/0053869 A1 | 5/2002 | Ahn et al. |
| 2002/0068466 A1 | 6/2002 | Lee et al. |
| 2002/0086507 A1 | 7/2002 | Park et al. |
| 2002/0086521 A1 | 7/2002 | Ahn et al. |
| 2002/0086555 A1 | 7/2002 | Ahn et al. |
| 2002/0089063 A1 | 7/2002 | Ahn et al. |
| 2002/0094632 A1 | 7/2002 | Agarwal et al. |
| 2002/0111001 A1 | 8/2002 | Ahn |
| 2002/0121665 A1 | 9/2002 | Kawasaki et al. |
| 2002/0122885 A1 | 9/2002 | Ahn |
| 2002/0130338 A1 | 9/2002 | Ahn et al. |
| 2002/0135048 A1 | 9/2002 | Ahn et al. |
| 2002/0137330 A1 | 9/2002 | Ryan |
| 2002/0142536 A1 | 10/2002 | Zhang et al. |
| 2002/0146874 A1 | 10/2002 | Kawasaki et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0167057 A1 | 11/2002 | Ahn et al. |
| 2002/0167089 A1 | 11/2002 | Ahn et al. |
| 2002/0177282 A1 | 11/2002 | Song |
| 2002/0192974 A1 | 12/2002 | Ahn et al. |
| 2002/0192975 A1 | 12/2002 | Ahn |
| 2002/0192979 A1 | 12/2002 | Ahn |
| 2003/0001241 A1 | 1/2003 | Chakrabarti et al. |
| 2003/0003635 A1 | 1/2003 | Paranjpe et al. |
| 2003/0003702 A1 | 1/2003 | Ahn |
| 2003/0008235 A1 | 1/2003 | Inoue et al. |
| 2003/0008243 A1 | 1/2003 | Ahn et al. |
| 2003/0016619 A1 | 1/2003 | Judge et al. |
| 2003/0017717 A1 | 1/2003 | Ahn |
| 2003/0020180 A1 | 1/2003 | Ahn et al. |
| 2003/0032238 A1 | 2/2003 | Kim et al. |
| 2003/0032270 A1 | 2/2003 | Snyder et al. |
| 2003/0040196 A1 | 2/2003 | Lim et al. |
| 2003/0042527 A1 | 3/2003 | Forbes et al. |
| 2003/0043633 A1 | 3/2003 | Forbes et al. |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0049942 A1 | 3/2003 | Haukka et al. |
| 2003/0059535 A1 | 3/2003 | Luo et al. |
| 2003/0060146 A1 | 3/2003 | Kashiwaya et al. |
| 2003/0068848 A1 | 4/2003 | Hsu et al. |
| 2003/0072882 A1 | 4/2003 | Niinisto et al. |
| 2003/0092213 A1 | 5/2003 | Yamazaki et al. |
| 2003/0104666 A1 | 6/2003 | Bojarczuk, Jr. et al. |
| 2003/0111678 A1 | 6/2003 | Colombo et al. |
| 2003/0119246 A1 | 6/2003 | Ahn |
| 2003/0119291 A1 | 6/2003 | Ahn et al. |
| 2003/0119313 A1 | 6/2003 | Yang et al. |
| 2003/0124748 A1 | 7/2003 | Summerfelt et al. |
| 2003/0124791 A1 | 7/2003 | Summerfelt et al. |
| 2003/0132491 A1 | 7/2003 | Ahn |
| 2003/0136995 A1 | 7/2003 | Geusic et al. |
| 2003/0137019 A1 | 7/2003 | Maria et al. |
| 2003/0139039 A1 | 7/2003 | Ahn et al. |
| 2003/0157764 A1 | 8/2003 | Ahn et al. |
| 2003/0161081 A1 | 8/2003 | Girardie |
| 2003/0170389 A1 | 9/2003 | Sandhu |
| 2003/0170450 A1 | 9/2003 | Stewart et al. |
| 2003/0175411 A1 | 9/2003 | Kodas et al. |
| 2003/0176065 A1 | 9/2003 | Vaartstra |
| 2003/0179521 A1 | 9/2003 | Girardie |
| 2003/0181039 A1 | 9/2003 | Sandhu et al. |
| 2003/0181060 A1 | 9/2003 | Asai et al. |
| 2003/0183156 A1 | 10/2003 | Dando et al. |
| 2003/0185980 A1 | 10/2003 | Endo |
| 2003/0200917 A1 | 10/2003 | Vaartstra |
| 2003/0205742 A1 | 11/2003 | Hsu et al. |
| 2003/0207032 A1 | 11/2003 | Ahn et al. |
| 2003/0207540 A1 | 11/2003 | Ahn et al. |
| 2003/0213987 A1 | 11/2003 | Basceri |
| 2003/0216038 A1 | 11/2003 | Madhukar et al. |
| 2003/0222300 A1 | 12/2003 | Basceri et al. |
| 2003/0227033 A1 | 12/2003 | Ahn et al. |
| 2003/0228747 A1 | 12/2003 | Ahn et al. |
| 2003/0235134 A1 | 12/2003 | Inoue et al. |
| 2004/0004244 A1 | 1/2004 | Ahn et al. |
| 2004/0004245 A1 | 1/2004 | Forbes et al. |
| 2004/0004247 A1 | 1/2004 | Forbes |
| 2004/0004859 A1 | 1/2004 | Forbes |
| 2004/0007171 A1 | 1/2004 | Ritala et al. |
| 2004/0009679 A1 | 1/2004 | Yeo et al. |
| 2004/0013009 A1 | 1/2004 | Tsunoda et al. |
| 2004/0016944 A1 | 1/2004 | Ahn et al. |
| 2004/0023461 A1 | 2/2004 | Ahn et al. |
| 2004/0027966 A1 | 2/2004 | Inoue et al. |
| 2004/0028811 A1 | 2/2004 | Cho et al. |
| 2004/0032812 A1 | 2/2004 | Inoue et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0036129 A1 | 2/2004 | Forbes et al. |
| 2004/0038554 A1 | 2/2004 | Ahn |
| 2004/0040494 A1 | 3/2004 | Vaartstra et al. |
| 2004/0040501 A1 | 3/2004 | Vaartstra |
| 2004/0041192 A1 | 3/2004 | Baker |
| 2004/0041591 A1 | 3/2004 | Forbes |
| 2004/0043151 A1 | 3/2004 | Vaartstra |

| | | |
|---|---|---|
| 2004/0043541 A1 | 3/2004 | Ahn et al. |
| 2004/0043569 A1 | 3/2004 | Ahn et al. |
| 2004/0043578 A1 | 3/2004 | Marsh |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0070649 A1 | 4/2004 | Hess et al. |
| 2004/0076035 A1 | 4/2004 | Saito et al. |
| 2004/0077177 A1 | 4/2004 | Andreoni et al. |
| 2004/0092061 A1 | 5/2004 | Kawasaki et al. |
| 2004/0092073 A1 | 5/2004 | Cabral, Jr. et al. |
| 2004/0094801 A1 | 5/2004 | Liang et al. |
| 2004/0097022 A1 | 5/2004 | Werkhoven et al. |
| 2004/0106249 A1 | 6/2004 | Huotari |
| 2004/0110348 A1 | 6/2004 | Ahn et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0135186 A1 | 7/2004 | Yamamoto |
| 2004/0140470 A1 | 7/2004 | Kawasaki et al. |
| 2004/0140513 A1 | 7/2004 | Forbes et al. |
| 2004/0142546 A1 | 7/2004 | Kudo et al. |
| 2004/0144980 A1 | 7/2004 | Ahn et al. |
| 2004/0146805 A1 | 7/2004 | Kato et al. |
| 2004/0152254 A1 | 8/2004 | Vaartstra et al. |
| 2004/0157158 A1 | 8/2004 | Kakiuchi et al. |
| 2004/0159863 A1 | 8/2004 | Eldridge et al. |
| 2004/0161883 A1 | 8/2004 | Colombo et al. |
| 2004/0161899 A1 | 8/2004 | Luo et al. |
| 2004/0164357 A1 | 8/2004 | Ahn et al. |
| 2004/0164365 A1 | 8/2004 | Ahn et al. |
| 2004/0168627 A1 | 9/2004 | Conley, Jr. et al. |
| 2004/0169453 A1 | 9/2004 | Ahn et al. |
| 2004/0171280 A1 | 9/2004 | Conley, Jr. et al. |
| 2004/0174804 A1 | 9/2004 | Kakiuchi et al. |
| 2004/0175882 A1 | 9/2004 | Ahn et al. |
| 2004/0178439 A1 | 9/2004 | Ahn et al. |
| 2004/0180171 A1 | 9/2004 | Takasaki et al. |
| 2004/0183108 A1 | 9/2004 | Ahn |
| 2004/0185654 A1 | 9/2004 | Ahn |
| 2004/0187968 A1 | 9/2004 | Vaartstra |
| 2004/0188778 A1 | 9/2004 | Aoyama |
| 2004/0189175 A1 | 9/2004 | Ahn et al. |
| 2004/0190435 A1 | 9/2004 | Hosoda et al. |
| 2004/0191462 A1 | 9/2004 | Hosoda et al. |
| 2004/0191685 A1 | 9/2004 | Kakiuchi et al. |
| 2004/0191687 A1 | 9/2004 | Fukuzawa et al. |
| 2004/0191689 A1 | 9/2004 | Shingai et al. |
| 2004/0197946 A1 | 10/2004 | Vaartstra et al. |
| 2004/0203254 A1 | 10/2004 | Conley, Jr. et al. |
| 2004/0208105 A1 | 10/2004 | Shingai et al. |
| 2004/0213124 A1 | 10/2004 | Shingai et al. |
| 2004/0214399 A1 | 10/2004 | Ahn et al. |
| 2004/0219746 A1 | 11/2004 | Vaartstra et al. |
| 2004/0222476 A1 | 11/2004 | Ahn et al. |
| 2004/0235313 A1 | 11/2004 | Frank et al. |
| 2004/0238904 A1 | 12/2004 | Colombo et al. |
| 2004/0241581 A1 | 12/2004 | Kakiuchi et al. |
| 2004/0248387 A1 | 12/2004 | Kawasaki et al. |
| 2004/0248398 A1 | 12/2004 | Ahn et al. |
| 2004/0262700 A1 | 12/2004 | Ahn et al. |
| 2004/0264236 A1 | 12/2004 | Chae et al. |
| 2004/0266117 A1 | 12/2004 | Hwang |
| 2004/0266217 A1 | 12/2004 | Kim et al. |
| 2005/0009266 A1 | 1/2005 | Vaartstra |
| 2005/0009368 A1 | 1/2005 | Vaartstra |
| 2005/0009370 A1 | 1/2005 | Ahn |
| 2005/0018590 A1 | 1/2005 | Inoue et al. |
| 2005/0018591 A1 | 1/2005 | Inoue et al. |
| 2005/0018592 A1 | 1/2005 | Inoue et al. |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023578 A1 | 2/2005 | Bhattacharyya |
| 2005/0023594 A1 | 2/2005 | Ahn et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026458 A1 | 2/2005 | Basceri et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0047301 A1 | 3/2005 | Inoue et al. |
| 2005/0047302 A1 | 3/2005 | Inoue et al. |
| 2005/0047303 A1 | 3/2005 | Inoue et al. |
| 2005/0047304 A1 | 3/2005 | Inoue et al. |
| 2005/0047305 A1 | 3/2005 | Inoue et al. |
| 2005/0047306 A1 | 3/2005 | Inoue et al. |
| 2005/0048249 A1 | 3/2005 | Inoue et al. |
| 2005/0051828 A1 | 3/2005 | Park et al. |
| 2005/0054165 A1 | 3/2005 | Ahn et al. |
| 2005/0059198 A1 | 3/2005 | Visokay et al. |
| 2005/0070062 A1 | 3/2005 | Visokay et al. |
| 2005/0070098 A1 | 3/2005 | Bruley |
| 2005/0077519 A1 | 4/2005 | Ahn et al. |
| 2005/0079696 A1 | 4/2005 | Colombo |
| 2005/0087134 A1 | 4/2005 | Ahn |
| 2005/0106797 A1 | 5/2005 | Colombo |
| 2005/0112499 A1 | 5/2005 | Nakai et al. |
| 2005/0124109 A1 | 6/2005 | Quevado-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0136689 A9 | 6/2005 | Vaartstra |
| 2005/0138262 A1 | 6/2005 | Forbes |
| 2005/0142324 A1 | 6/2005 | Hayashida et al. |
| 2005/0145957 A1 | 7/2005 | Ahn et al. |
| 2005/0145959 A1 | 7/2005 | Forbes |
| 2005/0156256 A1 | 7/2005 | Kim et al. |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0170208 A1 | 8/2005 | Yatsunami et al. |
| 2005/0173755 A1 | 8/2005 | Forbes |
| 2005/0181607 A1 | 8/2005 | Aoyama |
| 2005/0207308 A1 | 9/2005 | Kobayashi et al. |
| 2005/0212119 A1 | 9/2005 | Shero et al. |
| 2005/0215015 A1 | 9/2005 | Ahn et al. |
| 2005/0217722 A1 | 10/2005 | Komatsu et al. |
| 2005/0218462 A1 | 10/2005 | Ahn et al. |
| 2005/0221006 A1 | 10/2005 | Vaartstra |
| 2005/0221623 A1 | 10/2005 | Passlack et al. |
| 2005/0227442 A1 | 10/2005 | Ahn et al. |
| 2005/0233247 A1 | 10/2005 | Hosoda et al. |
| 2005/0243677 A1 | 11/2005 | Kobayashi et al. |
| 2005/0260357 A1* | 11/2005 | Olsen et al. .................. 427/569 |
| 2005/0263756 A1 | 12/2005 | Yatsunami et al. |
| 2005/0270963 A1 | 12/2005 | Mishima et al. |
| 2005/0277256 A1 | 12/2005 | Ahn et al. |
| 2005/0280067 A1 | 12/2005 | Ahn et al. |
| 2005/0285208 A1 | 12/2005 | Ren et al. |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001151 A1 | 1/2006 | Ahn et al. |
| 2006/0003517 A1 | 1/2006 | Ahn et al. |
| 2006/0003529 A1 | 1/2006 | Baker |
| 2006/0019033 A1 | 1/2006 | Muthukrishnan et al. |

| | | |
|---|---|---|
| 2006/0023513 A1 | 2/2006 | Forbes et al. |
| 2006/0024975 A1 | 2/2006 | Ahn et al. |
| 2006/0028867 A1 | 2/2006 | Forbes et al. |
| 2006/0028869 A1 | 2/2006 | Forbes et al. |
| 2006/0043367 A1 | 3/2006 | Chang et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0084247 A1 | 4/2006 | Liu |
| 2006/0110870 A1 | 5/2006 | Bhattacharyya |
| 2006/0118890 A1 | 6/2006 | Li |
| 2006/0121744 A1 | 6/2006 | Quevedo-Lopez et al. |
| 2006/0125030 A1 | 6/2006 | Ahn et al. |
| 2006/0148180 A1 | 7/2006 | Ahn et al. |
| 2006/0153051 A1 | 7/2006 | Kikukawa et al. |
| 2006/0161942 A1 | 7/2006 | Kikukawa et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0205132 A1 | 9/2006 | Bhattacharyya |
| 2006/0223248 A1 | 10/2006 | Venugopal et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0244045 A1 | 11/2006 | Visokay et al. |
| 2006/0244082 A1 | 11/2006 | Ahn et al. |
| 2006/0244100 A1 | 11/2006 | Ahn et al. |
| 2006/0245339 A1 | 11/2006 | Fukuzawa et al. |
| 2006/0245984 A1 | 11/2006 | Kulkarni et al. |
| 2006/0246647 A1 | 11/2006 | Visokay et al. |
| 2006/0246651 A1 | 11/2006 | Chambers et al. |
| 2006/0246716 A1 | 11/2006 | Colombo et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258175 A1 | 11/2006 | Vaartstra et al. |
| 2006/0261389 A1 | 11/2006 | Vaartstra |
| 2006/0263972 A1 | 11/2006 | Ahn et al. |
| 2006/0264064 A1 | 11/2006 | Ahn et al. |
| 2006/0267113 A1 | 11/2006 | Tobin et al. |
| 2006/0270147 A1 | 11/2006 | Ahn et al. |
| 2006/0275577 A1 | 12/2006 | Nakai et al. |
| 2006/0278940 A1 | 12/2006 | Kato et al. |
| 2006/0280895 A1 | 12/2006 | Kikukawa et al. |
| 2006/0280896 A1 | 12/2006 | Kikukawa et al. |
| 2006/0281330 A1 | 12/2006 | Ahn et al. |
| 2006/0289863 A1 | 12/2006 | Iijima et al. |
| 2006/0289895 A1 | 12/2006 | Kamata |
| 2006/0292773 A1 | 12/2006 | Goolsby et al. |
| 2006/0292788 A1 | 12/2006 | Vaartstra |
| 2007/0006798 A1 | 1/2007 | Vaartstra et al. |
| 2007/0007635 A1 | 1/2007 | Forbes et al. |
| 2007/0010060 A1 | 1/2007 | Forbes et al. |
| 2007/0030795 A1 | 2/2007 | Kikuawa et al. |
| 2007/0037335 A1 | 2/2007 | Chambers et al. |
| 2007/0049054 A1 | 3/2007 | Ahn et al. |
| 2007/0059872 A1 | 3/2007 | Visokay et al. |
| 2007/0069241 A1 | 3/2007 | Yang et al. |
| 2007/0144438 A1 | 6/2007 | Vaartstra |
| 2007/0145454 A1 | 6/2007 | Bhattacharyya |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0295273 A1 | 12/2007 | Vaartstra |
| 2008/0054330 A1 | 3/2008 | Forbes et al. |
| 2008/0064210 A1 | 3/2008 | Vaartstra |
| 2008/0087890 A1 | 4/2008 | Ahn et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0220618 A1 | 9/2008 | Ahn et al. |
| 2008/0274625 A1 | 11/2008 | Ahn et al. |
| 2009/0079016 A1 | 3/2009 | Chen et al. |
| 2009/0155976 A1 | 6/2009 | Ahn et al. |
| 2009/0166748 A1 | 7/2009 | Takahashi |
| 2009/0173979 A1 | 7/2009 | Ahn et al. |
| 2009/0236650 A1 | 9/2009 | Forbes et al. |
| 2009/0294924 A1 | 12/2009 | Forbes et al. |
| 2010/0006918 A1 | 1/2010 | Ahn et al. |
| 2010/0029054 A1 | 2/2010 | Ahn et al. |
| 2010/0041244 A1 | 2/2010 | Forbes et al. |
| 2010/0044771 A1 | 2/2010 | Ahn et al. |
| 2010/0052033 A1 | 3/2010 | Ahn et al. |
| 2010/0176442 A1 | 7/2010 | Ahn et al. |
| 2010/0224944 A1 | 9/2010 | Ahn et al. |

FOREIGN PATENT DOCUMENTS

| | | |
|---|---|---|
| WO | WO-02/31875 | 4/2002 |
| WO | WO-02/43115 | 5/2002 |
| WO | WO-2006026716 A1 | 3/2006 |

OTHER PUBLICATIONS

Aarik, Jaan, "Atomic layer growth of epitaxial $TiO_2$ thin films from $TiCl_4$ and $H_2O$ on alpha -$Al_2O_3$ substrates", *Journal of Crystal Growth*, 242(1-2), (2002),189-198.

Aarik, Jaan, et al., "Hafnium tetraiodide and oxygen as precursors for atomic layer deposition of hafnium oxide thin films", *Thin Solid Films*, 418(2), (Oct. 15, 2002),69-72.

Aarik, Jaan, "Influence of substrate temperature on atomic layer growth and properties of $HfO_2$ thin films", *Thin Solid Films*, 340(1-2), (1999),110-116.

Aarik, Jaan, "Phase transformations in hafnium dioxide thin films grown by atomic layer deposition at high temperatures", *Applied Surface Science*, 173(1-2), (Mar. 2001),15-21.

Aarik, Jaan, "Texture development in nanocrystalline hafnium dioxide thin films grown by atomic layer deposition", *Journal of Crystal Growth*, 220(1-2), (Nov. 15, 2000),105-113.

Ahn, Kie Y., "Magnesium-Doped Zinc Oxide Structures and Methods", U.S. Appl. No. 11/706,820, filed Feb. 13, 2007.

Ahn, Kie Y., "Molybdenum-Doped Indium Oxide Structures and Methods", U.S. Appl. No. 11/706,944, filed Feb. 13, 2007.

Ahn, Kie Y., et al., "Tungsten-Doped Indium Oxide Structures and Methods", U.S. Appl. No. 11/706,498, filed Feb. 13, 2007.

Ahn, Kie Y., et al., "Zirconium-Doped Zinc Oxide Structures and Methods", U.S. Appl. No. 11/707,173, filed Feb. 13, 2007.

Apostolopoulos, G., et al., "Complex admittance analysis for $La_2Hf_2O_7$-$SiO_2$ high-k dielectric stacks", *Applied Physics Letters*, 84(2), (Jan. 12, 2004),260-262.

Chin, A., et al., "High Quality $La_2O_3$ and $Al_2O_3$ Gate Dielectrics with Equivalent Oxide Thickness 5-10A", *Digest of Technical Papers. 2000 Symposium on VLSI Technology*, 2000, Honolulu, (Jun. 13-15, 2000),16-17.

Colombo, D., et al., "Anhydrous Metal Nitrates as Volatile Single Source Precursors for the CVD of Metal Oxide Films", *Communications, Department of EE*, U of M, Mpls, MN, (Jul. 7, 1998),3 pages.

Conley, J. F., "Atomic Layer Deposition of Hafnium Oxide Using Anhydrous Hafnium Nitrate", *Electrochemical and Solid-State Letters*, 5(5), (May 2002),C57-C59.

Copel, M., et al., "Formation of a stratified lanthanum silicate dielectric by reaction with Si(001)", *Applied Physics Letters*, 78(11), (Mar. 12, 2001),1607-1609.

Copel, M., et al., "Structure and stability of ultrathin zirconium oxide layers on Si(001)", *Applied Physics Letters*, 76(4), (Jan. 2000),436-438.

Forbes, Leonard, "Memory Utilizing Oxide-Conductor Nanolaminates", U.S. Appl. No. 11/496,196, filed Jul. 31, 2006.

Geller, S., et al., "Crystallographic Studies of Perovskite-like Compounds. II. Rare Earth Aluminates", *Acta Cryst.*, 9, (May 1956),1019-1025.

Giess, E. A., et al., "Lanthanide gallate perovskite-type substrates for epitaxial, high-$T_c$ superconducting $Ba_2YCu_3O_7$ delta / films", *IBM Journal of Research and Development*, 34(6), (Nov. 1990),916-926.

Guha, S , et al., "Atomic beam deposition of lanthanum-and yttrium-based oxide thin films for gate dielectrics", *Applied Physics Letters*, 77, (2000),2710-2712.

Ho, M.-Y. , et al., "Suppressed crystallization of Hf-based gate dielectrics by controlled addition of $Al_2O_3$ using atomic layer deposition" *Applied Physics Letters*, vol. 81, No. 22, (Nov. 2002),4218-4220.

Huang, C. H., et al., "$La_2O_3/Si_{0.3}Ge_{0.7}$ p-MOSFETs with high hole mobility and good device characteristics", *IEEE Electron Device Letters*, 23(12), (Dec. 2002),710-712.

Hubbard, K. J., et al., "Thermodynamic stability of binary oxides in contact with silicon", *Journal of Materials Research*, 11(11), (Nov. 1996),2757-2776.

Inumiya, Seiji , et al., "Fabrication of HfSiON gate dielectrics by plasma oxidation and nitridation, optimized for 65 nm mode low power CMOS applications", *2003 Symposium on VLSI Technology Digest of Technical Papers*, (Jun. 10-12, 2003),17-18.

Iwamoto, K. , "Advanced Layer-By-Layer Deposition and Annealing Process For High-Quality High-K Dielectrics Formation", *Electrochemical Society Proceedings* vol. 2003 (14), (2203),265-272.

Jeon, Sanghun , et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001),471-474.

Jeong, Chang-Wook , "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001),285-289.

Jun, Jin H., et al., "Effect of Structural Properties on Electrical Properties of Lanthanum Oxide Thin Film as a Gate Dielectric", *Japanese Journal of Applied Physics, 42, Part 1, No. 6A*, (Jun.15, 2003),3519-3522.

Jun, Jin H., et al., "Properties of Lanthanum Aluminate Thin Film Deposited by MOCVD", *Electrochemical and Solid-State Letters*, 6(11), (2003),F37-F39.

Jun, Jino , et al., "Study on the precursors for $La_2O_3$ thin films deposited on silicon substrate", *Journal of Materials Science Letters 21*, (2002),1847-1849.

Kim, D. , et al., "Atomic Control of Substrate Termination and Heteroepitaxial Growth of $SrTiO_3LaAlO_3$ Films", *Journal of the Korean Physical Society*, 36(6), (Jun. 2000),444-448.

Kim, C. T., "Application of Al2O3 Grown by Atomic Layer Deposition to DRAM and FeRAM", *12th International Symposium in Integrated Ferroelectrics*, (Mar., 2000),p. 316.

Kim, Y , "Substrate dependence on the optical properties of $Al_2O_3$ films grown by atomic layer deposition", *Applied Physics Letters*, vol. 71, No. 25, (Dec. 22, 1997),3604-3606.

Kingon, Angus I., et al., "Alternative dielectrics to Silicon dioxide for Memory and Logic Devices", *Nature*, vol. 406, (Aug. 31, 2000),1032-1038.

Kukli, Kaupo , "Comparison of hafnium oxide films grown by atomic layer deposition from iodide and chloride precursors", *Thin Solid Films*, 416, (2002),72-79.

Kukli, Kaupo , "Tailoring the dielectric properties of $HfO_2$-$Ta_2O_3$ nanolaminates", *Appl. Phys. Lett.*, 68, (1996),3737-3739.

Kwo, J. , et al., "High E gate dielectrics $Gd_2O_3$ and $Y_2O_3$ for silicon", *Applied Physics Letters*, 77(1), (Jul. 3, 2000),130-132.

Kwo, J. , "Properties of high k gate dielectrics $Gd_2O_3$ and $Y_2O_3$ for Si", *Journal of Applied Physics*, 89(7), (2001),3920-3927.

Lee, A E., et al., "Epitaxially grown sputtered $LaAlO_3$ films", *Applied Physics Letters*, 57(19), (Nov. 1990),2019-2021.

Lee, Jack C., et al., "High-k dielectrics and MOSFET characteristics", *IEDM '03 Technical Digest. IEEE International Electron Devices Meeting*, 2003, (Dec. 8-10, 2003),4.4.1-4.4.4.

Lee, Byoung H., et al., "Thermal stability and electrical characteristics of ultrathin hafnium oxide gate dielectric reoxidized with rapid thermal annealing", *Applied Physics Letters*, 76(14), (Apr. 3, 2000),1926-1928.

Leskela, M. , "ALD precursor chemistry: Evolution and future challenges", *J. Phys. IV France*, 9, (1999),837-852.

Li, Al-Dong , "Characteristics of $LaAlO_3$ gate dielectrics on Si grown by metalorganic chemical vapor deposition", *Applied Physics Letters*, vol. 83, No. 17, (Oct. 27, 2003),3540-3542.

Lu, X. B., et al., "Investigation of high-quality ultra-thin $LaAlO_3$ films as high-k gate dielectrics", *Journal of Physics D: Applied Physics*, 36, (Dec. 7, 2003),3047-3050.

Lu, Xu-Bing , et al., "Structure and dielectric prioperties of amorphous LaAlO3 and LaAlOxNy films as alternative gate dielectric materials", *Journal of Applied Physics*, vol. 94, No. 2, (Jul. 15, 2003),1229-1234.

Maria, J. P., et al., "High temperature stability in lanthanum and zirconia-based gate dielectrics", *Journal of Applied Physics*, 90(7), (Oct. 1, 2001),3476-3482.

Masson, Pascal , et al., "Frequency characterization and modeling of interface traps in $HfSi_xO_yHfO_2$ gate dielectric stack from a capacitance point-of-view", *Applied Physics Letters*, 81(18), (Oct. 28, 2002),3392-3394.

Michaelson, Herbert B., "The work function of the elements and its periodicity", *Journal of Applied Physics*, 48(11), (Nov. 1977),4729-4733.

Molodyk, A A., et al., "Volatile Surfactant-Assisted MOCVD: Application to $LaAlO_3$ Thin Film Growth", *Chemical Vapor Deposition*, 6(3)1 (Jun. 2000),133-138.

Nalwa, H. S., "Handbook of Thin Film Materials", *Deposition and Processing of thin Films*, vol. 1, San Diego : Academic Press,(2002),114-119.

Nieminen, Minna , et al., "Formation and stability of lanthanum oxide thin films deposited from B-diketonate precursor", *Applied Surface Science*, 174(2), (Apr. 16, 2001),155-165.

Osten, H. J., et al., "High-k gate dielectrics with ultra-low leakage current based on praseodymium oxide", *International Electron Devices Meeting 2000. Technical Digest. IEDM*, (2000),653-656.

Park, Dae-Gyu , et al., "Characteristics of $Al_2O_3$ Gate Dielectrics Prepared by Atomic Layer Deposition for Giga Scale CMOS DRAM Devices", *2000 Symposium on VLSI Technology Digest of Technical Papers*, (2000),46-47.

Park, Byung-Eun , et al., "Electrical properties of $LaAlO_3Si$ and $Sr_{0.8}Bi_{2.2}Ta_2O_9LaAlO_3Si$ structures", *Applied Physics Letters*, 79(6), (Aug. 2001),806-808.

Ritala, M. , "Atomic layer deposition of oxide thin films with metal alkoxides as oxygen sources", *Science*, 288(5464), (Apr. 14, 2000),319-321.

Robertson, J. , "Band offsets of wide-band-gap oxides and implications for future electronic devices", *Journal of Vacuum Science & Technology B (Microelectronics and Nanometer Structures)*, 18(3), (May-Jun. 2000),1785-1791.

Roy, P. K., et al., "Stacked high-E gate dielectric for gigascale integration of metal-oxide-semiconductor technologies", *Applied Physics Letters*, vol. 72, No. 22, (Jun. 1998),2835-2837.

Shannon, R. D., "Dielectric polarizabilities of ions in oxides and fluorides", *Journal of Applied Physics*, 73(1), (Jan. 1, 1993),348-366.

Shanware, A. , et al., "Characterization and comparison of the charge trapping in HfSiON and $HfO_2$ gate dielectrics", *IEEE International Electron Devices Meeting, 2003. IEDM '03 Technical Digest.*, (Dec. 8-10, 2003),38.6.1-38.6.4.

Shimizu, Takashi , et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A (2003),L1315-L1317.

Shin, Chang H., "Fabrication and Characterization of MFISFET Using Al2O3 Insulating Layer for Non-volatile Memory", *12th International Symposium in Integrated Ferroelectrics*, (Mar. 2000),9 pages.

Sneh, Ofer , "Thin film atomic layer deposition equipment for semiconductor processing", *Thin Solid Films*, 402(1-2), (2002),248-261.

Suntola, T. , "Atomic Layer Epitaxy", *Handbook of Crystal Growth, 3: Thin Films of Epitaxy, Part B: Growth Mechanics and Dynamics*, Amsterdam,(1994),601-663.

Suntola, Tuomo , "Atomic layer epitaxy", *Thin Solid Films*, 216(1), (Aug. 28, 1992),84-89.

Van Dover, R B., "Amorphous lanthanide-doped $TiO_x$ dielectric films", *Applied Physics Letters*, 74(20), (May 1999),3041-3043.

Wilk, G. D., "High-K gate dielectrics: Current status and materials properties considerations", *Journal of Applied Physics,* 89(10), (May 2001),5243-5275.

Yamamoto, K. , "Effect of Hf metal predeposition on the properties of sputtered $HfO_2$Hf stacked gate dielectrics", *Applied Physics Letters,* 81, (Sep. 9, 2002),2053-2055.

Yan, L. , "High quality, high-k gate dielectric: amorphous $LaAlO_3$ thin films grown on Si(100) without Si interfacial layer", *Appl. Phys. A 77,* (2003),721-724.

Yu, Xiongfei , et al., "High Mobility and Excellent Electrical Stability of MOSFETs Using a Novel HfTaO Gate Dielectric", *2004 Symposium on VLSI Technology Digest of Technical Papers,* (Jun. 15-17, 2004),110-111.

Zhang, H. , "Atomic Layer Deposition of High Dielectric Constant Nanolaminates", *Journal of the Electrochemical Society,* 148(4), (Apr. 2001),F63-F66.

Zhang, H , et al., "High permitivity thin film nanolaminates", *Journal of Applied Physics,* 87(4), (Feb. 2000),1921-1924.

Zhong, Huicai , et al., "Electrical Properties of Ru and $RuO_2$ Gate Electrodes for Si-PMOSFET with Zr02 and Zr-Silicate Dielectrics", *Journal of Electronic Materials,* 30(12), (Dec. 2001),1493-1498.

Puurunen, Riikka L, "Surface chemistry of atomic layer deposition: A case study for the trimethylaluminum/water process", J. Appl. Phys. 97, (2005), 121301 (52 pgs.).

Alen, Petra, "Atomic Layer Deposition of TaN, NbN, and MoN Films for Cu Metallizations", *University of Helsinki Academic Dissertation,* Laboratory of Inorganic Chemistry, Department of Chemistry, University of Helsinki, Finland, (2005), 72 pgs.

Alen, Petra, et al., "Tert-Butylamine and allylamine as reductive nitrogen sources in atomic layer deposition of TaN thin films", *Journal of Materials Research,* 17(1), (Jan. 2002), 107-114.

\* cited by examiner

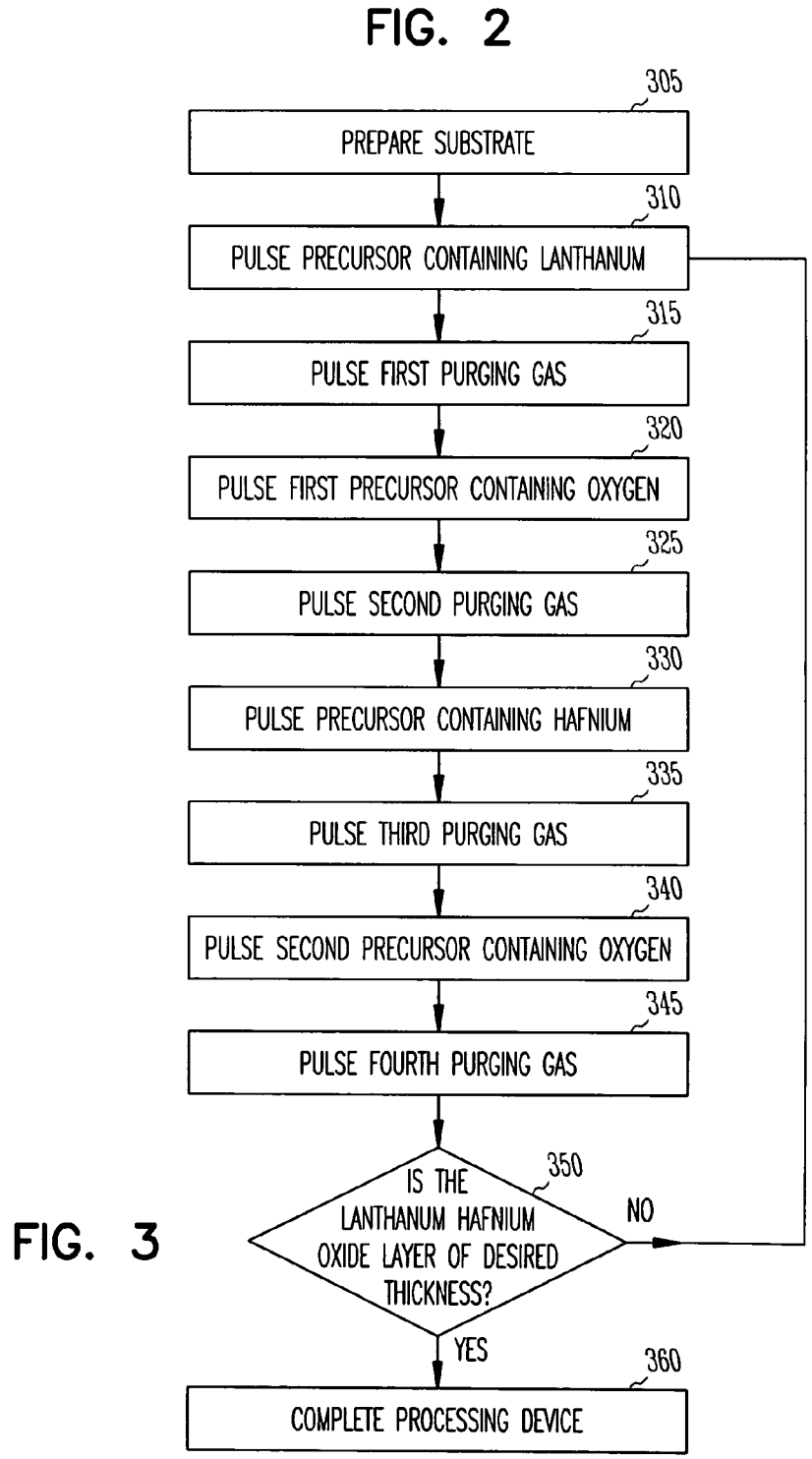

DIELECTRIC STACK CONTAINING LANTHANUM AND HAFNIUM

CROSS REFERENCE TO RELATED APPLICATION

This application is a continuation of U.S. application Ser. No. 11/584,229, filed Oct. 20, 2006, now U.S. Pat. No. 7,411,237 which is a divisional of U.S. application Ser. No. 11/010,529, filed Dec. 13, 2004, now U.S. Pat. No. 7,235,501, which applications are incorporated herein by reference in their entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

BRIEF DESCRIPTION OF THE DRAWINGS

FIG. 2 illustrates a flow diagram of elements for an embodiment of a method to form a dielectric layer containing a lanthanum hafnium oxide layer by atomic layer deposition.

FIG. 3 illustrates a flow diagram of elements for an embodiment of a method to form a dielectric layer containing a lanthanum hafnium oxide layer by atomic layer deposition.

DETAILED DESCRIPTION

Figure 1:
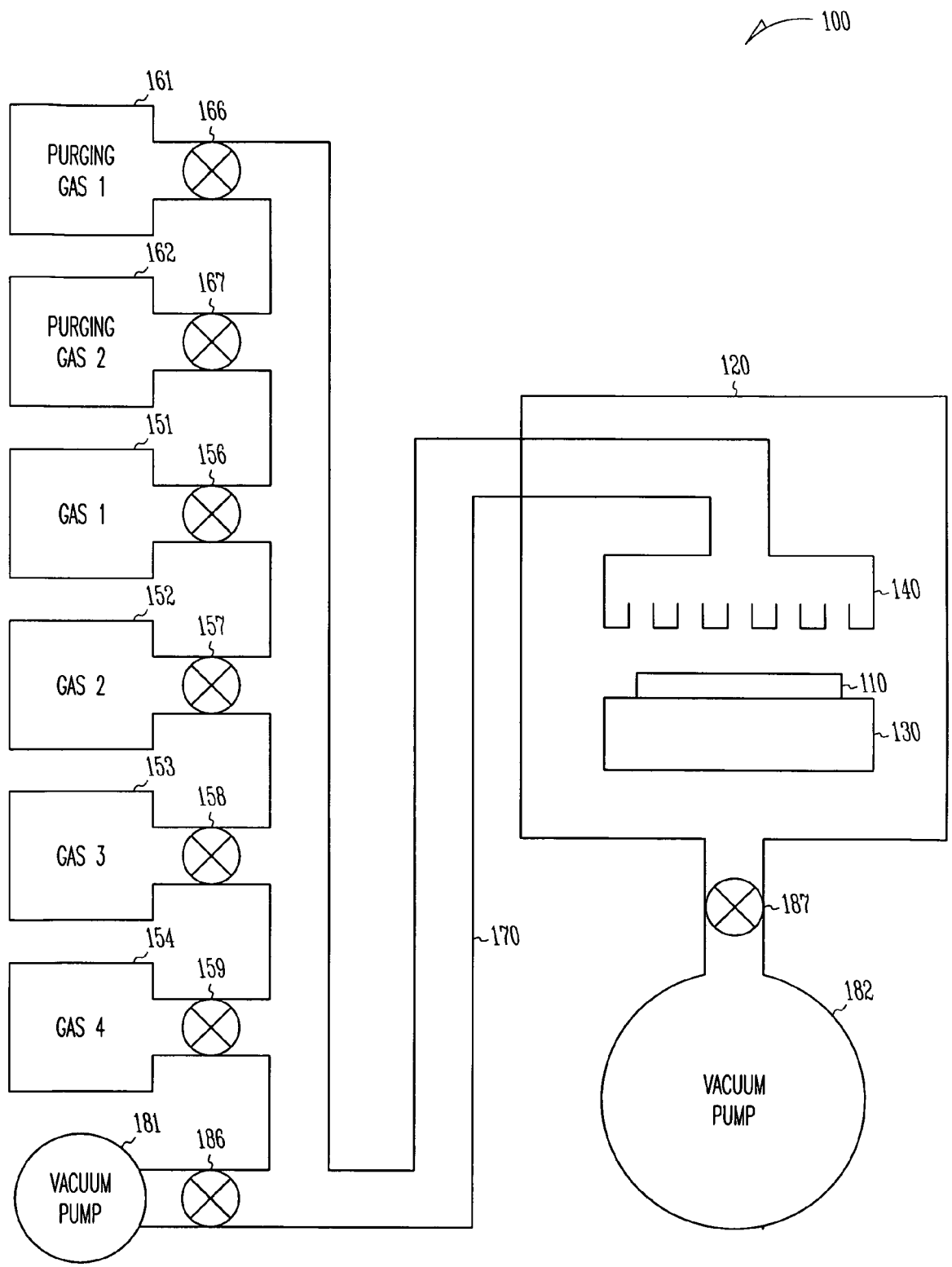
FIG. 1 depicts an atomic layer deposition system for fabricating a dielectric layer containing a lanthanum hafnium oxide layer, according to various embodiments.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)\,t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Candidates to replace $SiO_2$ include high-$\kappa$ dielectric materials. High-$\kappa$ materials include materials having a dielectric constant greater than silicon dioxide, for example, dielectric materials having a dielectric constant greater than about twice the dielectric constant of silicon dioxide. An appropriate high-$\kappa$ gate dielectric should have a large energy gap ($E_g$) and large energy barrier heights with Si for both electrons and holes. Generally, the bandgap is inversely related to the dielectric constant for a high-$\kappa$ material, which lessens some advantages of the high-$\kappa$ material. A set of high-$\kappa$ dielectric candidates for replacing silicon oxide as the dielectric material in electronic components in integrated circuit includes lanthanide oxides, $HfO_2$, $ZrO_2$, $TiO_2$, $Y_2O_3$ and other binary metal oxides.

An embodiment for a method of forming an electronic device includes forming a dielectric layer containing a lanthanum hafnium oxide layer formed by atomic layer deposition. Embodiments include structures for capacitors, transistors, memory devices, and electronic systems with dielectric layers containing an atomic layer deposited lanthanum hafnium oxide layer, and methods for forming such structures.

Embodiments of dielectric layers containing an atomic layer deposited lanthanum hafnium oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

In an embodiment, a lanthanum hafnium oxide layer is formed in an integrated circuit by atomic layer deposition using a trisethylcyclopentadionatolanthanum $(La(EtCp)_3)$ precursor to provide the lanthanum. In an embodiment, a lanthanum hafnium oxide layer is formed in an integrated circuit by atomic layer deposition using a trisdipyvaloylmethanatolanthanum $(La(DPM)_3)$ precursor to provide the lanthanum. An embodiment includes forming the lanthanum hafnium oxide using a $La(EtCp)_3$ and a $La(DPM)_3$ precursor gas. Alternatively, the lanthanum hafnium oxide layer may be formed by atomic layer deposition using a tris (2,2,6,6-tetramethyl-3,5-heptanedionato)lanthanum (III) tetraglyme adduct, which may be written as $La(C_{11}H_{19}O_2)_3CH_3(OCH_2CH_2)_4OCH_3$, and/or a tris (2,2,6,6-tetramethyl-3,5-heptanedionato)lanthanum (III), which may be written as $La(C_{11}H_{19}O_2)_3$, as one or more precursor gases.

A number of hafnium-containing precursors may be used to provide hafnium for the lanthanum hafnium oxide layer. In an embodiment, a hafnium halide precursor, including $HfI_4$ and/or $HfCl_4$, is used. In an embodiment, a hafnium nitrate precursor is used. Other solid or liquid precursors may be used in an appropriately designed reaction chamber.

A lanthanum hafnium oxide is a compound of lanthanum, hafnium, and oxygen. A lanthanum hafnium oxide may also be referred to as a hafnium lanthanum oxide. In an embodiment, the lanthanum hafnium oxide may be formed substantially as stoichiometric lanthanum hafnium oxide. In an embodiment, the lanthanum hafnium oxide is substantially formed as $La_2Hf_2O_7$. In an embodiment, the lanthanum hafnium oxide may be formed substantially as a non-stoichiometric lanthanum hafnium oxide. A mixture of hafnium oxide and lanthanum oxide is a combination of a compound of hafnium oxide and a compound of lanthanum oxide. A mixture of hafnium oxide and lanthanum oxide may be realized as a lanthanum oxide rich mixture, a hafnium oxide rich mixture, or substantially having approximately the same amount of lanthanum oxide and hafnium oxide.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a lanthanum hafnium oxide dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited lanthanum hafnium oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of a precursor followed by its reactant precursor. For example, forming lanthanum oxide from a La(thd)$_3$ (thd=2,2,6,6-tetramethyl-3,5-heptanedione) precursor and ozone, as its reactant precursor, forms an embodiment of a lanthanum/oxygen sequence, which can also be referred to as lanthanum sequence. A cycle of a sequence includes pulsing a precursor, pulsing a purging gas for the precursor, pulsing a reactant precursor, and pulsing the reactant's purging gas. For an oxide compound containing two or more metals, a cycle may contain a number of sequences corresponding to each metal of the metals in the compound. However, in forming a layer of a metal species, an ALD sequence deals with reacting a precursor containing the metal species with a substrate surface. A cycle for such a metal forming sequence includes pulsing a purging gas after pulsing the precursor containing the metal species to form a metal layer. In an embodiment, a layer of lanthanum hafnium oxide is formed on a substrate mounted in a reaction chamber using ALD in repetitive lanthanum and hafnium sequences using precursor gases individually pulsed into the reaction chamber.

FIG. 1 shows an embodiment of an atomic layer deposition system 100 for processing a dielectric film containing lanthanum hafnium oxide. The elements depicted permit discussion of various embodiments such that those skilled in the art may practice similar embodiments without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154, whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases, fewer purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases from gas conduit 170 at the end of a purging sequence.

Vacuum pump, or exhaust pump, 182 is coupled by mass-flow controller 187 to remove excess precursor gases, purging gases, and by-product gases from reaction chamber 120 at the end of a purging sequence. For convenience, control displays, mounting apparatus, temperature sensing devices, substrate maneuvering apparatus, and necessary electrical connections as are known to those skilled in the art are not shown in FIG. 1. Though ALD system 100 is well suited for performing various embodiments, other commercially available ALD systems can be used.

The use, construction and fundamental operation of reaction chambers for deposition of films are understood by those of ordinary skill in the art of semiconductor fabrication. Embodiments may be practiced on a variety of such reaction chambers without undue experimentation. Furthermore, one of ordinary skill in the art will comprehend the necessary detection, measurement, and control techniques in the art of semiconductor fabrication upon studying this disclosure.

The elements of ALD system 100 can be controlled by a computer. To focus on the use of ALD system 100 in the various embodiments, the computer is not shown. Those skilled in the art can appreciate that the individual elements such as pressure control, temperature control, and gas flow within ALD system 100 can be under computer control.

FIG. 2 illustrates a flow diagram of elements for an embodiment of a method to form a dielectric layer containing a lanthanum hafnium oxide layer using atomic layer deposition. At 210, in an atomic layer deposition process, a precursor containing lanthanum is pulsed onto a substrate surface of an integrated circuit to deposit lanthanum. The precursor may be a La(EtCp)$_3$ precursor and/or a La(DPM)$_3$ precursor. La(EtCp)$_3$ has a melting point of about 95° C. and has a vapor pressure that is significantly higher than the vapor pressure of La(DPM)$_3$. The use of La(EtCp)$_3$ and/or La(DPM)$_3$ as the lanthanum-containing precursor may depend on the application of the electronic device being fabricated. Alternatively, a La(C$_{11}$H$_{19}$O$_2$)$_3$CH$_3$(OCH$_2$CH$_2$)$_4$OCH$_3$ precursor and/or a La(C$_{11}$H$_{19}$O$_2$)$_3$ precursor may be pulsed to deposit lanthanum on the substrate surface. In addition, the pulsing of the lanthanum precursor may use a pulsing period that provides uniform coverage of a monolayer on the surface or may use a pulsing period that provides partial formation of a monolayer on the surface during a lanthanum sequence.

At 220, a precursor containing hafnium is pulsed. In an embodiment, a hafnium halide precursor, such as HfI$_4$ or HfCl$_4$, may be used to deposit hafnium by atomic layer deposition. In an embodiment, a hafnium nitrate precursor may be used to deposit hafnium by atomic layer deposition. The hafnium may be deposited before depositing lanthanum in an atomic layer deposition process for forming a lanthanum hafnium oxide. In addition, the pulsing of the hafnium precursor may use a pulsing period that provides uniform coverage of a monolayer on the surface or may use a pulsing period that provides partial formation of a monolayer on the surface during a hafnium sequence.

In an embodiment, a lanthanum hafnium oxide may be formed substantially as stoichiometric lanthanum hafnium oxide such as $La_2Hf_2O_7$. In an embodiment, a lanthanum hafnium oxide may be formed substantially as a non-stoichiometric lanthanum hafnium oxide (represented as $La_xHf_{1-x}O_y$) or a combination of non-stoichiometric lanthanum hafnium oxide and stoichiometric lanthanum hafnium oxide. Alternatively, the dielectric layer may be formed containing the atomic layer deposited lanthanum hafnium oxide layer and one or more layers of other dielectric materials including, but not limited to, dielectric nitrides, dielectric metal silicates, dielectric metal oxides including $Al_2O_3$, $HfO_2$, $La_2O_3$, and other lanthanide oxides such as $Pr_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. These one or more other layers of insulating oxides may be provided in stoichiometric form, in non-stoichiometric form, or a combination of stoichiometric insulating oxides and non-stoichiometric insulating oxides.

FIG. 3 illustrates a flow diagram of elements for an embodiment of a method to form a dielectric layer containing an atomic layer deposited lanthanum hafnium oxide layer. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. Alternatively, these active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanum hafnium oxide dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a $SiO_2$ interface layer, or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor; however, one skilled in the art will recognize that other semiconductor device structures may utilize this process. Additionally, the substrate 110 in its ready for processing form is conveyed into a position in reaction chamber 120 for ALD processing.

At 310, a precursor containing lanthanum, such as a $La(EtCp)_3$ precursor, is pulsed into reaction chamber 120. The $La(EtCp)_3$ is pulsed into reaction chamber 120 through the gas-distribution fixture 140 onto substrate 110. The flow of the $La(EtCp)_3$ is controlled by mass-flow controller 156 from gas source 151, where the $La(EtCp)_3$ is maintained. In an embodiment, the substrate temperature is maintained at a temperature ranging from about 400° C. to about 650° C. In an embodiment, the substrate temperature is maintained at about 650° C. Alternatively, the substrate temperature may be maintained at temperatures less than 650° C. by heating element 130. The $La(EtCp)_3$ reacts with the surface of the substrate 110 in the desired region defined by the unmasked areas of the substrate 110. In other embodiments, $La(DPM)_3$ is used as a lanthanum-containing precursor. In an embodiment, $H_2$ may be pulsed along with the $La(EtCp)_3$ precursor or the $La(DPM)_3$ precursor to reduce carbon contamination in the deposited film. In an embodiment, a $La(C_{11}H_{19}O_2)_3CH_3(OCH_2CH_2)_4OCH_3$, and/or a $La(C_{11}H_{19}O_2)_3$ precursor may be used as a precursor to deposit lanthanum on substrate 110. In an embodiment using a $La(C_{11}H_{19}O_2)_3CH_3(OCH_2CH_2)_4OCH_3$, and/or a $La(C_{11}H_{19}O_2)_3$ precursor, substrate 110 may be maintained at about 350° C. Nitrogen gas may be used as a carrier gas for precursors containing lanthanum.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. In an embodiment, argon gas or other inert gas may be used as the purging gas. Following the purge, a first oxygen-containing precursor is pulsed into the reaction chamber 120, at 320.

For a lanthanum sequence using $La(EtCp)_3$ or $La(DPM)_3$ as the precursor, water vapor may be selected as the precursor acting as a reactant to deposit lanthanum and oxygen on the substrate 110. The $H_2O$ vapor is pulsed into the reaction chamber 120 through gas conduit 170 from gas source 152 by mass-flow controller 157. The water vapor aggressively reacts at the surface of substrate 110. For a lanthanum sequence using a $La(C_{11}H_{19}O_2)_3CH_3(OCH_2CH_2)_4OCH_3$, and/or a $La(C_{11}H_{19}O_2)_3$ precursor, oxygen may be used as the reactant precursor to provide the surface of substrate 110 with lanthanum and oxygen.

Following the pulsing of the first oxygen-containing precursor, a second purging gas is injected into the reaction chamber 120, at 325. Nitrogen gas may be used to purge the reaction chamber after pulsing each precursor gas in the lanthanum/oxygen sequence. In an embodiment, argon gas or other inert gas may be used as the purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

At 330, a precursor containing hafnium is pulsed into reaction chamber 120. In an embodiment, hafnium tetraiodide is used as the precursor containing hafnium. The $HfI_4$ is pulsed to the surface of the substrate 110 through gas-distribution fixture 140 from gas source 153 by mass-flow controller 158. The $HfI_4$ is introduced onto the lanthanum and oxygen formed during the lanthanum sequence. As an alternate hafnium sequence, a $HfCl_4$ precursor may be employed. During pulsing of the hafnium-containing precursor, the substrate may be held between about 400° C. and about 700° C. by the heating element 130. In an embodiment, an anhydrous hafnium nitrate may be used as a precursor. Substrate 110 may be maintained at a temperature of about 160° C. in an embodiment using an anhydrous hafnium nitrate precursor.

At 335, a third purging gas is introduced into the system. In an embodiment, nitrogen may be used as a purging and carrier gas. Alternatively, purified argon may be used as a purging gas. The flow of the third purging gas is controlled by mass-flow controller 167 from the purging gas source 162 into the gas conduit 170 and subsequently into the reaction chamber 120.

At 340, a second oxygen-containing precursor is pulsed into the reaction chamber 120. Oxygen may be used as the precursor acting as an oxidizing reactant to interact at the substrate 110. The oxygen is pulsed into the reaction chamber 120 through gas conduit 170 from gas source 154 by mass-flow controller 159. The oxygen aggressively reacts at the surface of substrate 110 to form a lanthanum hafnium oxide.

At 345, a fourth purging gas is injected into the reaction chamber 120. In an embodiment, nitrogen gas is used as the fourth purging gas to purge the reaction chamber. Alternatively, argon gas may be used as the fourth purging gas. Excess precursor gas and reaction by-products are removed from the system by the purge gas, in conjunction with the exhausting of the reaction chamber 120 using vacuum pump 182 through mass-flow controller 187, and exhausting of the gas conduit 170 by the vacuum pump 181 through mass-flow controller 186.

At 350, it is determined whether the lanthanum hafnium oxide film is of the desired thickness, t. The thickness of a lanthanum hafnium oxide film after one cycle is determined by the pulsing periods used in the lanthanum sequence and the hafnium sequence at a given temperature. Typically, at a given temperature, the pulsing periods can vary over a significant range above some minimum pulse time for the precursors, without substantially altering the growth rate. Once a set of periods for one cycle is determined, the growth rate for the lanthanum hafnium oxide film will be set at a value such as N nm/cycle. For a desired lanthanum hafnium oxide film thickness in an application, such as forming a gate dielectric of a MOS transistor, the ALD process should be repeated for t/N cycles. The desired thickness should be completed after t/N cycles. If less than t/N cycles have been completed, the process starts over at 310 with the pulsing of the precursor containing lanthanum. If t/N cycles have completed, no further ALD processing is requires and the lanthanum hafnium oxide film is completed. Once the total number of cycles to form the desired thickness has been completed, the dielectric film containing the lanthanum hafnium oxide layer may optionally be annealed. In an embodiment, completion of a desired composition of the dielectric layer is followed by annealing at a temperature ranging from about 900° C. to about 1000° C.

At 360, after forming the lanthanum hafnium oxide layer, processing the device having the dielectric layer containing lanthanum hafnium oxide layer is completed. In an embodiment, completing the device includes further processing of the dielectric layer to include layers of other dielectric materials. In an embodiment, completing the device includes completing the formation of a transistor. In another embodiment, completing the device includes completing the formation of a capacitor. Alternatively, completing the process includes completing the construction of a memory device having an array with access transistors formed with gate dielectrics containing atomic layer deposited lanthanum hafnium oxide layer. Further, in another embodiment, completing the process includes the formation of an electronic system including an information handling device that uses electronic devices with transistors formed with dielectric films containing an atomic layer deposited lanthanum hafnium oxide layer. Typically, information handling devices such as computers include many memory devices, having many access transistors.

Embodiments for methods having elements similar to the embodiment of FIG. 3 may include numerous permutations for forming the lanthanum hafnium oxide layer. In an embodiment, the hafnium sequence is conducted before the lanthanum sequence. In an embodiment, a lanthanum/hafnium cycle may include a number, x, of lanthanum sequences and a number, y, of hafnium sequences. The number of sequences x, y may be selected to engineer the relative amounts of lanthanum to hafnium. In an embodiment, the number of sequences x and y, along with associated pulsing periods and times, is selected to form a lanthanum hafnium oxide with substantially equal amounts of lanthanum and hafnium. In an embodiment, the number of sequences is selected with x=y. In an embodiment, the number of sequences x and y are selected to form a lanthanum-rich lanthanum hafnium oxide. Alternatively, the number of sequences x and y are selected to form a hafnium-rich lanthanum hafnium oxide. In an embodiment, one or more sequences of depositing lanthanum metal and one or more sequences of depositing hafnium metal are conducted before introducing a reactant precursor to oxidize the lanthanum and hafnium. In an embodiment using metal depositing sequences, a mixture of lanthanum and hafnium may be provided on the substrate surface that is oxidized when the reactant oxidizing precursor is introduced to the substrate surface. In an embodiment, an amorphous lanthanum hafnium oxide layer is formed.

In an embodiment, the lanthanum hafnium oxide layer may be doped with other lanthanides such as Pr, Nd, Sm, Gd, Dy, Ce, Tb, Er, Eu, Lu, Tm, Ho, Pm, and Yb. The doping may be employed to enhance the leakage current characteristics of the dielectric layer containing the lanthanum hafnium oxide by providing a disruption or perturbation of the lanthanum hafnium oxide structure. Such doping may be realized by substituting a sequence of one of these lanthanides for a lanthanum sequence or a hafnium sequence. The choice for substitution may depend on the form of the lanthanum hafnium oxide structure with respect to the ratio of lanthanum atoms to hafnium desired in the oxide. To maintain a substantially lanthanum hafnium oxide, the amount of alternate lanthanides doped into the oxide may be limited to a relatively small fraction of the total number of lanthanum and hafnium atoms. Such a fraction may be 10 percent or less. In an embodiment, to maintain a substantially lanthanum hafnium oxide, the amount of alternate lanthanides doped into the oxide may be limited to a relatively small fraction of the lanthanum or the hafnium atoms based on which material is selected to have the smallest number of atoms. Such a fraction may be 10 percent or less.

Various embodiments for fabricating a lanthanum hafnium oxide may provide an oxide whose crystalline form is cubic with a pyrochlore structure. In an embodiment, forming a lanthanum hafnium oxide includes forming $La_2Hf_2O_7$. The lattice constant for $La_2Hf_2O_7$ is about 1.078 nm, which is approximately twice the lattice constant of silicon. Further, the embodiments described herein provide a process for growing a lanthanum hafnium oxide layer having a wide range of useful equivalent oxide thickness, $t_{eq}$, associated with a dielectric constant in the range from about 16 to about 22. This range of dielectric constants provides for a $t_{eq}$ ranging from about 17% to about 25% relative to a given silicon dioxide thickness. In an embodiment, a dielectric layer containing a lanthanum hafnium oxide layer has a $t_{eq}$ ranging from about 4 Å to about 30 Å. In an embodiment, a dielectric layer containing a lanthanum hafnium oxide layer has a $t_{eq}$ of less than 5 Å.

Use of embodiments for forming dielectrics having a lanthanum hafnium oxide layer to replace $SiO_2$ as a dielectric in integrated circuits may include evaluating the stability of the lanthanum hafnium oxide layer in contact with silicon and the quality of the lanthanum hafnium oxide/silicon interface. An interfacial layer may form between the lanthanum hafnium oxide layer and the silicon. In addition to modifying the effective dielectric constant of the dielectric formed on the silicon, such an interface may affect the electrical properties of the silicon surface region where active performance of devices in an integrated circuit may occur.

The interface influences the density of interface states. The lanthanum hafnium oxide/silicon interface may be characterized to allow modification of the process parameters or adjustment of the dielectric composition and thickness to reduce adverse effects of an interface that may be formed. Such characterization methods may include determining interface trap kinetics (interface trap energy distribution and capture cross section) by simultaneously modeling the structure's complex admittance, $Y=G+i\omega C$, where G is conductance, C is capacitance, and $\omega$ is angular frequency. Conductance, G, is from MIS (metal insulator semiconductor) conductance analysis and capacitance, C, is from C-V (capacitance-voltage) characteristics at various frequencies. For ultra thin dielectrics, analysis may include a self-consistent quantum-mechanical calculation to include charge quantization effect in the semiconductor on which the lanthanum hafnium oxide is constructed. The application of interface trap kinetics and charge quantization provides for accurate determination of the dielectric capacitance and characterization of the interface properties for evaluation and improvement of the dielectric layer.

Various embodiments may include dielectrics having a layer substantially of lanthanum hafnium oxide. Embodiments may include dielectrics having a layer of lanthanum hafnium oxide disposed on a silicon oxide layer. The silicon oxide layer may be formed using a variety of methods including atomic layer deposition. Embodiments may include a dielectric having an acceptable silicon dioxide thickness of a predetermined amount in which an embodiment for a lanthanum hafnium oxide may include a thickness ranging from greater than two to less than eight times that of the acceptable silicon dioxide thickness providing enhanced probability for reducing leakage current. In an embodiment, a lanthanum hafnium oxide film is formed with a thickness ranging from two to three monolayers to a hundred angstroms. Further, dielectric films of lanthanum hafnium oxide layer formed by atomic layer deposition can provide not only thin $t_{eq}$ films, but also films with relatively low leakage current. Additionally, the novel process can be implemented to form transistors, capacitors, memory devices, and other electronic systems including information handling devices.

Figure 4:
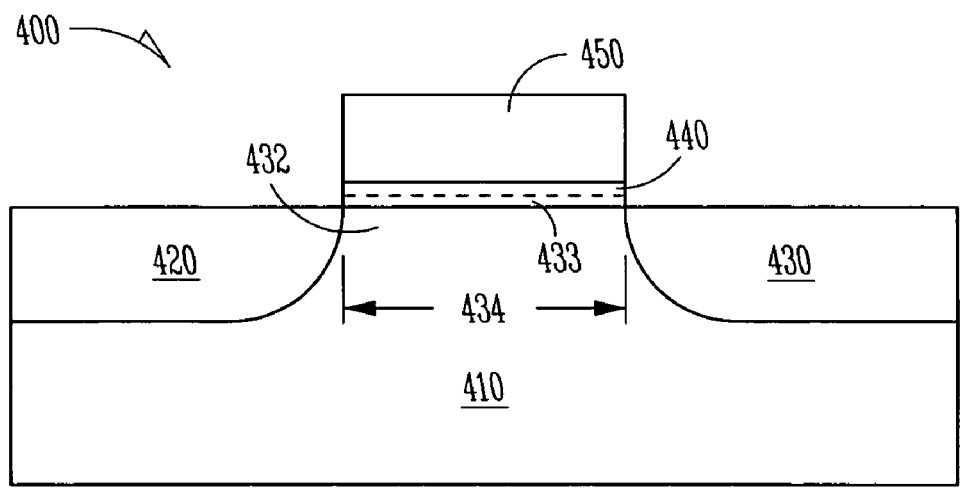
FIG. 4 shows an embodiment of a configuration of a transistor having a dielectric layer containing an atomic layer deposited lanthanum hafnium oxide layer.

A transistor 400 as depicted in FIG. 4 may be constructed including using an embodiment for forming a dielectric layer containing a lanthanum hafnium oxide layer by atomic layer deposition. Transistor 400 includes a source region 420 and a drain region 430 in a silicon based substrate 410 where source and drain regions 420, 430 are separated by a body region 432. Body region 432 defines a channel having a channel length 434. A dielectric layer is disposed on substrate 410 formed as a dielectric layer containing lanthanum hafnium oxide on substrate 410 by atomic layer deposition. The resulting dielectric layer forms gate dielectric 440. Gate dielectric 440 may be realized as a dielectric layer formed substantially of lanthanum hafnium oxide. Gate dielectric 440 may contain one or more insulating layers in which at least one layer is a lanthanum hafnium oxide layer. In an embodiment, gate dielectric 440 may include a lanthanum hafnium oxide layer disposed on a silicon oxide layer on body region 432. A gate 450 is formed over and contacts gate dielectric 440.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Interfacial layer 433 may be formed as a lanthanum silicate, a hafnium silicate, or a silicate of lanthanum hafnium. Forming the substrate, the gate, and the source and drain regions may be performed using standard processes known to those skilled in the art. Additionally, the sequencing of the various elements of the process for forming a transistor may be conducted with standard fabrication processes, as known to those skilled in the art. In an embodiment, gate dielectric 440 may be realized as a gate insulator in a silicon CMOS transistor. Transistor 400 is not limited to silicon based substrates, but may be used with a variety of semiconductor substrates.

Figure 5:
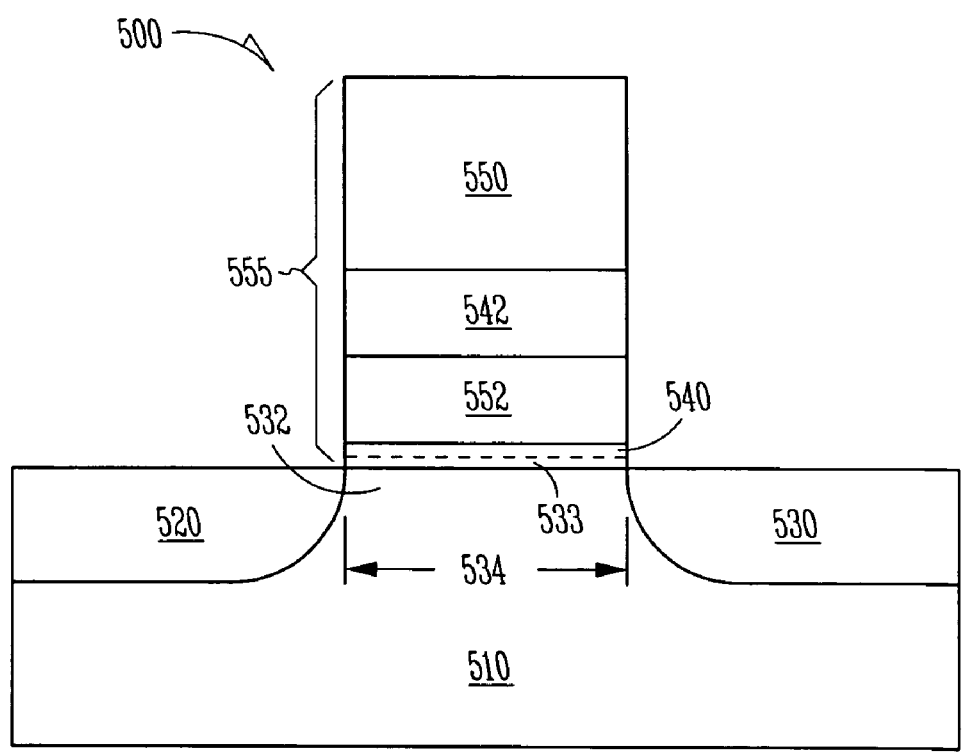
FIG. 5 shows an embodiment of a configuration of a floating gate transistor having a dielectric layer containing an atomic layer deposited lanthanum hafnium oxide layer.

FIG. 5 shows an embodiment of a configuration of a floating gate transistor 500 having an embodiment of an atomic layer deposited lanthanum hafnium oxide layer dielectric film. Transistor 500 includes a silicon based substrate 510 with a source 520 and a drain 530 separated by a body region 532. However, transistor 500 is not limited to silicon based substrates, but may be used with a variety of semiconductor substrates. Body region 532 between source 520 and drain 530 defines a channel region having a channel length 534. Located above body region 532 is a stack 555 including a gate dielectric 540, a floating gate 552, a floating gate dielectric 542, and a control gate 550. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

Gate dielectric 540 includes a dielectric containing an atomic layer deposited lanthanum hafnium oxide layer formed in embodiments similar to those described herein. Gate dielectric 540 may be realized as a dielectric layer formed substantially of lanthanum hafnium oxide. Gate dielectric 540 may include one or more dielectric layers in which at least one layer is a lanthanum hafnium oxide layer. In an embodiment, gate dielectric 540 may include a lanthanum hafnium oxide layer disposed on a silicon oxide layer on body region 532. In an embodiment, floating gate 552 is formed over and contacts gate dielectric 540.

In an embodiment, floating gate dielectric 542 includes a dielectric containing an atomic layer deposited lanthanum hafnium oxide layer formed in embodiments similar to those described herein. Floating gate dielectric 542 may be realized as a dielectric layer formed substantially of lanthanum hafnium oxide. Floating gate dielectric 542 may include one or more insulating layers in which at least one layer is a lanthanum hafnium oxide layer. In an embodiment, control gate 550 is formed over and contacts floating gate dielectric 542.

Alternatively, both gate dielectric 540 and floating gate dielectric 542 may be formed as dielectric layers containing an atomic layer deposited lanthanum hafnium oxide layer. Floating gate 552 and floating gate dielectric 542 may be realized by embodiments similar to those described herein, with the remaining elements of the transistor 500 formed using processes known to those skilled in the art. In an embodiment, gate dielectric 540 forms a tunnel gate insulator and floating gate dielectric 542 forms an inter-gate insulator in flash memory devices, where gate dielectric 540 and/or floating gate dielectric 542 include an atomic layer deposited lanthanum hafnium oxide film. Use of dielectric layers containing an atomic layer deposited lanthanum hafnium oxide layer for a gate dielectric and/or floating gate dielectric is not limited to silicon based substrates, but may be used with a variety of semiconductor substrates.

Figure 6:
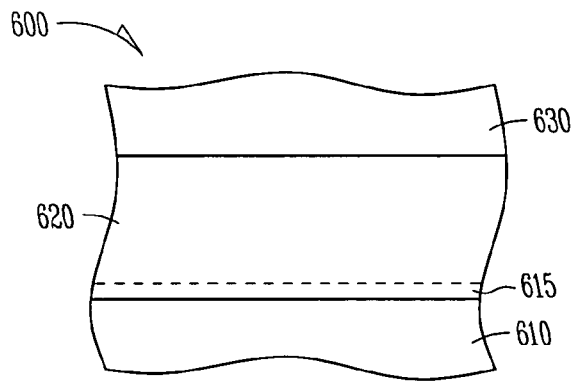
FIG. 6 shows an embodiment of a configuration of a capacitor having a dielectric layer containing an atomic layer deposited lanthanum hafnium oxide layer.

Embodiments of methods for forming dielectric layers containing an atomic layer deposited lanthanum hafnium oxide layer may also be applied to forming capacitors in various integrated circuits, memory devices, and electronic systems. In an embodiment for forming a capacitor 600 illustrated in FIG. 6, a method includes forming a first conductive layer 610, forming a dielectric layer 620 containing an atomic layer deposited lanthanum hafnium oxide layer on first conductive layer 610, and forming a second conductive layer 630 on dielectric layer 620. Dielectric layer 620 containing a lanthanum hafnium oxide layer may be formed using any of the embodiments described herein. An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of lanthanum hafnium oxide. Dielectric layer 620 may include one or more insulating layers in which at least one layer is substantially lanthanum hafnium oxide. In an embodiment, gate dielectric 620 may include a lanthanum hafnium oxide layer contacting a silicon oxide layer. Embodiments for dielectric layer 620 containing an atomic layer deposited lanthanum hafnium oxide layer in a capacitor include, but are not limited to, dielectrics in DRAM capacitors and dielectrics in capacitors in analog, radio frequency (RF), and mixed signal integrated circuits.

Various embodiments for a dielectric film containing atomic layer deposited lanthanum hafnium oxide may provide for enhanced device performance by providing devices with reduced leakage current. Such improvements in leakage current characteristics may be attained by forming one or more layers of an atomic layer deposited lanthanum hafnium oxide in a nanolaminate structure with other metal oxides including hafnium oxide or one or more lanthanide oxides, and/or with other non-metal containing dielectrics. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a nanolaminate contains layers of lanthanum hafnium oxide and a lanthanide oxide. In an embodiment, a nanolaminate contains layers of lanthanum hafnium oxide and hafnium oxide. In an embodiment, a nanolaminate contains layers of lanthanum hafnium oxide, a lanthanide oxide, and hafnium lanthanum oxide.

Figure 7:
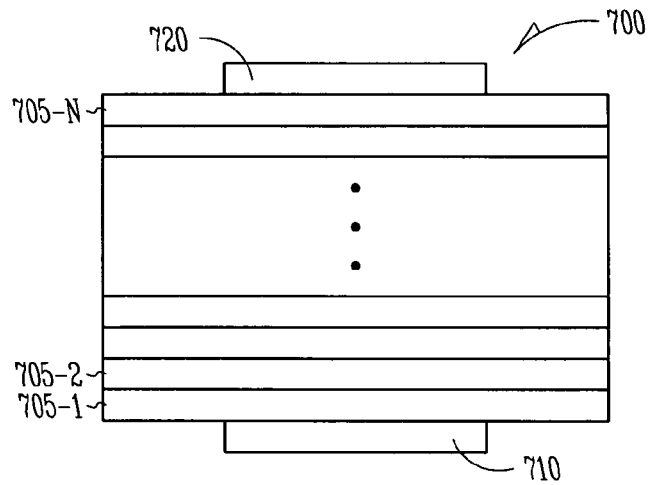
FIG. 7 depicts an embodiment of a dielectric layer including a nanolaminate having at least one layer containing an atomic layer deposited lanthanum hafnium oxide layer.

FIG. 7 depicts a nanolaminate structure 700 for an embodiment of a dielectric structure including an atomic layer deposited lanthanum hafnium oxide layer dielectric film. Nanolaminate structure 700 includes a plurality of layers 705-1, 705-2 to 705-N, where at least one layer contains a lanthanum hafnium oxide layer formed by atomic layer deposition, according to any of various embodiments for forming a lanthanum hafnium oxide layer. The other layers may be other dielectric layers or dielectric metal oxides including oxides of hafnium or one or more lanthanides (La, Pr, Nd, Sm, Gd, Dy, Ce, Tb, Er, Eu, Lu, Tm, Ho, Pm, or Yb) in stoichiometric form or in non-stoichiometric form. The sequencing of the layers depends on the application. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant. In an embodiment, nanolaminate structure 700 has conductive contacts 710 and 720 to provide electrical conductivity to the electronic device structure in which it is formed. Embodiments for structures such as nanolaminate structure 700 may be used as nanolaminate dielectrics in NROM flash memory devices as well as other integrated circuits.

Transistors, capacitors, and other devices having dielectric films containing atomic layer deposited lanthanum hafnium oxide layer formed by the methods described above may be implemented into memory devices and electronic systems including information handling devices. Embodiments of these information handling devices may include wireless systems, telecommunication systems, and computers. Further, embodiments of electronic devices having dielectric films containing an atomic layer deposited lanthanum hafnium oxide layer may be realized as integrated circuits.

Figure 8:
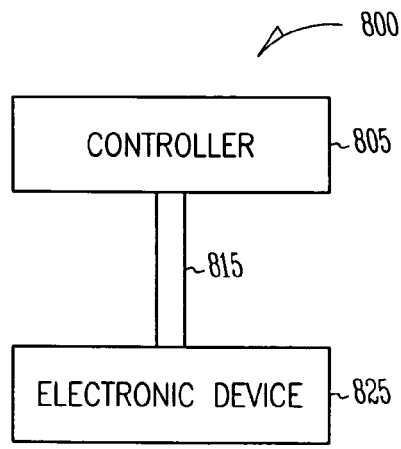
FIG. 8 is a simplified diagram for an embodiment of a controller coupled to an electronic device, in which at least one of the two includes a dielectric layer containing an atomic layer deposited lanthanum hafnium oxide layer.

FIG. 8 illustrates a diagram for an electronic system 800 having one or more devices having a dielectric layer containing an atomic layer deposited lanthanum hafnium oxide layer formed according to various embodiments. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer containing an atomic layer deposited lanthanum hafnium oxide layer as previously discussed herein. Electronic system 800 may include, but is not limited to, information handling devices, wireless systems, telecommunication systems, fiber optic systems, electro-optic systems, and computers.

Figure 9:
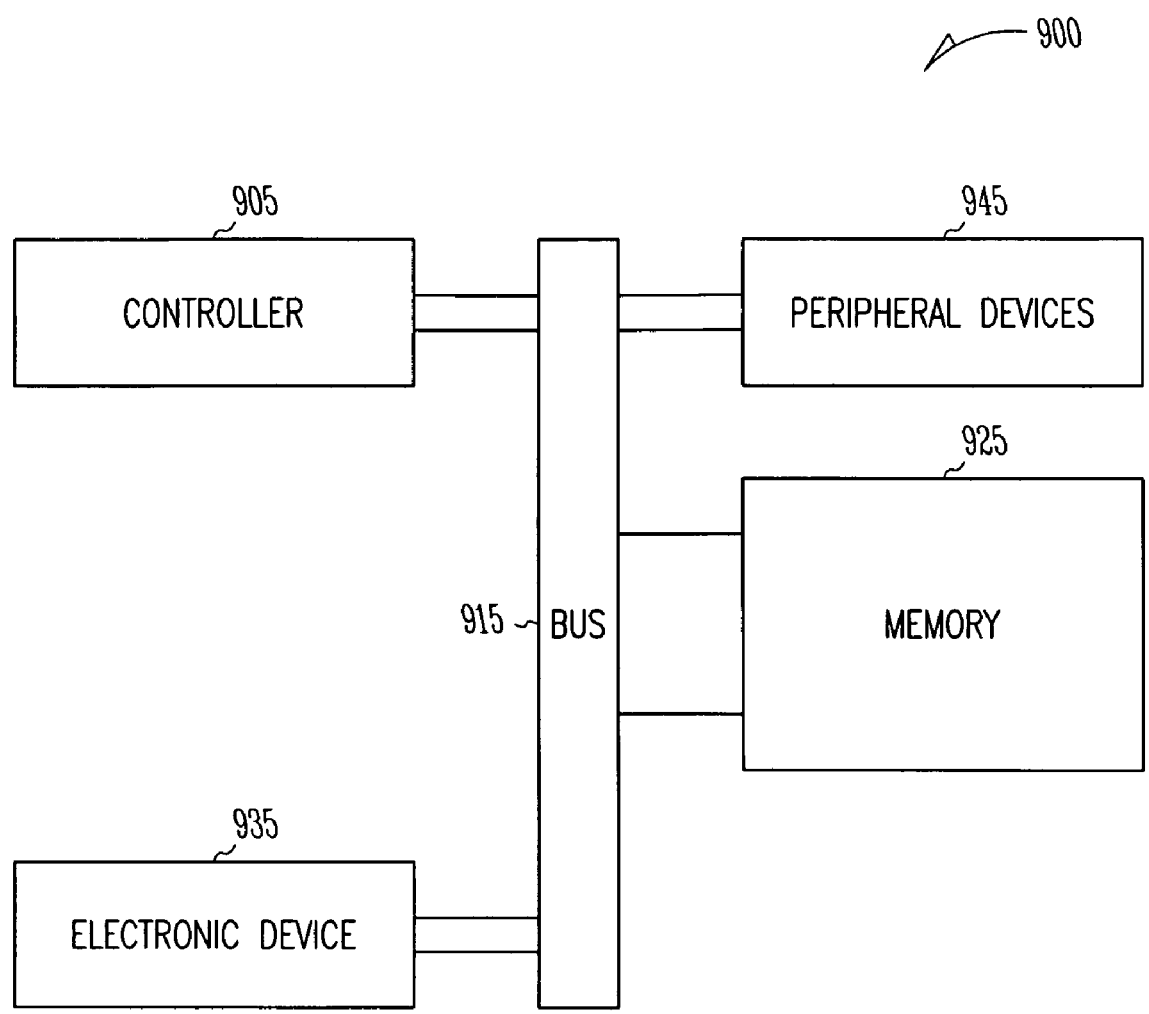
FIG. 9 illustrates a diagram for an embodiment of an electronic system having devices with a dielectric film containing an atomic layer deposited lanthanum hafnium oxide layer.

FIG. 9 depicts a diagram of an embodiment of a system 900 having a controller 905 and a memory 925. Controller 905 and/or memory 925 may include an embodiment of a dielectric layer having an atomic layer deposited lanthanum hafnium oxide layer. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternatively, bus 915 may use common conductive lines for providing address, data, and/or control, the use of which is regulated by controller 905. In an embodiment, electronic apparatus 935 may be additional memory configured similar to memory 925. An embodiment may include an additional peripheral device or devices 945 coupled to bus 915. In an embodiment, controller 905 is a processor. In an embodiment, controller 905 is a processor having a memory. Any of controller 905, memory 925, bus 915, electronic apparatus 935, and peripheral device devices 945 may include a dielectric layer having an atomic layer deposited lanthanum hafnium oxide layer. System 900 may include, but is not limited to, information handling devices, telecommunication systems, and computers.

Peripheral devices 945 may include displays, additional storage memory, or other control devices that may operate in conjunction with controller 905. Alternatively, peripheral devices 945 may include displays, additional storage memory, or other control devices that may operate in conjunction with controller 905 and/or memory 925.

Memory 925 may be realized as a memory device containing an atomic layer deposited lanthanum hafnium oxide layer. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Atomic layer deposited lanthanum hafnium oxide films may provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of layers containing atomic layer deposited lanthanum hafnium oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanum hafnium oxide are formed having a dielectric constant ($\kappa$) substantially higher than that of silicon oxide, such that these dielectric films are capable of a $t_{eq}$ thinner than $SiO_2$ gate dielectrics of the same physical thickness. Alternatively, the high dielectric constant relative to silicon dioxide allows the use of much larger physical thickness of these high-$\kappa$ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An electronic apparatus comprising:
   a dielectric stack having a plurality of dielectric layers including a dielectric layer containing lanthanum and hafnium, a layer of a lanthanide oxide without lanthanum, and a layer of dielectric material without a combination of lanthanum and hafnium, the dielectric stack forming a portion of a semiconductor-based device, the dielectric layer containing lanthanum and hafnium structured in a monolayer and/or partial monolayer arrangement.

2. The electronic apparatus of claim 1, wherein dielectric layer containing lanthanum and hafnium includes a mixture of lanthanum oxide and hafnium oxide.

3. The electronic apparatus of claim 1, wherein the dielectric layer containing lanthanum and hafnium consists essentially of $La_xHf_yO_z$ with x, y, and z being greater than zero.

4. The electronic apparatus of claim 1, wherein the dielectric stack includes a silicon oxide layer.

5. The electronic apparatus of claim 1, wherein the layer of dielectric material without a combination of lanthanum and hafnium includes a metal oxide layer.

6. The electronic apparatus of claim 1, wherein the dielectric stack includes a nanolaminate in which the dielectric layer containing lanthanum and hafnium is disposed.

7. A method comprising:
   forming a dielectric stack above a substrate, the dielectric stack formed as a portion of an integrated circuit, the dielectric stack having a plurality of dielectric layers including a dielectric layer containing lanthanum and hafnium, a layer of a lanthanide oxide without lanthanum, and a layer of dielectric material without a combination of lanthanum and hafnium;
   forming the dielectric stack containing lanthanum and hafnium, and forming using a monolayer and/or partial monolayer sequencing process, to form a monolayer and/or partial monolayer arrangement.

8. The method of claim 7, wherein forming the dielectric layer containing lanthanum and hafnium using a monolayer and/or partial monolayer sequencing process includes introducing the lanthanum and introducing the hafnium to the substrate at non-overlapping time intervals in the monolayer and/or partial monolayer sequencing process.

9. The method of claim 7, wherein forming the dielectric layer containing lanthanum and hafnium using a monolayer and/or partial monolayer sequencing process includes forming the dielectric layer containing lanthanum and hafnium by self-limiting growth.

10. The method of claim 7, wherein forming the dielectric stack includes forming a lanthanum oxide layer and forming a hafnium oxide layer.

11. The method of claim 7, wherein forming the dielectric stack includes forming the dielectric stack as a nanolaminate.

12. The method of claim 7, wherein forming the dielectric stack includes forming a metal oxide that does not include lanthanum or hafnium.

13. The method of claim 7, wherein forming the dielectric stack includes forming a dielectric nitride.

14. The method of claim 7, wherein forming the dielectric layer containing lanthanum and hafnium includes forming the layer consisting essentially of $La_xHf_yO_z$ with x, y, and z being greater than zero.

15. The method of claim 7, wherein forming the dielectric layer containing lanthanum and hafnium includes forming a layer of $La_xHf_yO_z$, with x, y, and z being greater than zero, and doping the layer of $La_xHf_yO_z$ with a dopant, the dopant being other than lanthanum, hafnium, or a combination of lanthanum and hafnium.

16. The method of claim 7, wherein the method includes forming the dielectric stack as a capacitor dielectric in a capacitor.

17. A method comprising:
   forming a source region and a drain region separated by a body region in a substrate;
   forming a dielectric stack above the body region, the dielectric stack having a plurality of dielectric layers including a dielectric layer containing lanthanum and hafnium, a layer of a lanthanide oxide without lanthanum, and a layer of dielectric material without a combination of lanthanum and hafnium;
   forming the dielectric layer containing lanthanum and hafnium using a monolayer and/or partial monolayer sequencing process to form a monolayer and/or partial monolayer arrangement; and
   forming a gate above the dielectric stack.

18. The method of claim 17, wherein forming a dielectric stack above the body region and forming a gate above the dielectric stack comprises forming the dielectric stack as an inter-gate insulator of a transistor and forming the gate as a control gate of the transistor.

19. The method of claim 17, wherein forming a dielectric stack above the body region and forming a gate above the dielectric stack comprises forming the dielectric stack as a tunnel insulator of a transistor and forming the gate as a floating gate of the transistor.

20. A method comprising:
   forming a memory array in an integrated circuit including
      forming a dielectric stack in the memory array above a substrate, the dielectric stack having a plurality of dielectric layers including a dielectric layer containing lanthanum and hafnium, a layer of a lanthanide oxide without lanthanum, and a layer of dielectric material without a combination of lanthanum and hafnium; and
   forming the dielectric stack containing lanthanum and hafnium using a monolayer and/or partial monolayer sequencing process, to form a monolayer and/or partial monolayer arrangement.

21. The method of claim 20, wherein the method includes forming the dielectric stack in a charge storage device in the memory array.

22. The method of claim 21, wherein the method includes forming the dielectric stack as a nanolaminate.

23. A method comprising:
   providing a controller;
   coupling an integrated circuit to the controller, wherein at least one of the integrated circuit or the controller includes a dielectric stack above a substrate, the dielectric stack having a plurality of dielectric layers including a dielectric layer containing lanthanum and hafnium, a layer of a lanthanide oxide without lanthanum, and a layer of dielectric material without a combination of lanthanum and hafnium, the dielectric stack containing lanthanum and hafnium formed using a monolayer and/or partial monolayer sequencing process, to form a monolayer and/or partial monolayer arrangement.

24. The method of claim 23, wherein the method includes forming the dielectric stack in a memory array disposed in the integrated circuit.

25. The method of claim 23, wherein the method includes forming a wireless system.

* * * * *